(12) United States Patent
Kim et al.

(10) Patent No.: US 9,209,184 B2
(45) Date of Patent: Dec. 8, 2015

(54) HIGH-INTEGRATION SEMICONDUCTOR DEVICE AND METHOD FOR FABRICATING THE SAME

(71) Applicant: Samsung Electronics Co., Ltd., Suwon-si (KR)

(72) Inventors: Ju-Youn Kim, Suwon-si (KR); Hyung-Soon Jang, Hwaseong-si (KR); Jong-Mil Youn, Yongin-si (KR); Tae-Won Ha, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/683,525

(22) Filed: Apr. 10, 2015

(65) Prior Publication Data
US 2015/0214227 A1     Jul. 30, 2015

Related U.S. Application Data

(63) Continuation of application No. 14/165,930, filed on Jan. 28, 2014, now Pat. No. 9,048,219.

(30) Foreign Application Priority Data

Jul. 15, 2013    (KR) .......................... 10-2013-0082936

(51) Int. Cl.
*H01L 27/092*      (2006.01)
*H01L 29/423*      (2006.01)
(Continued)

(52) U.S. Cl.
CPC ...... *H01L 27/092* (2013.01); *H01L 21/823807* (2013.01); *H01L 21/823814* (2013.01); *H01L 21/823821* (2013.01); *H01L 21/823842* (2013.01); *H01L 21/823871* (2013.01); *H01L 27/0924* (2013.01); *H01L 29/42376* (2013.01); *H01L 29/4983* (2013.01); *H01L 29/513* (2013.01)

(58) Field of Classification Search
CPC ..................... H01L 29/42376; H01L 29/0653; H01L 29/0615; H01L 27/092; H01L 29/4983; H01L 27/0924; H01L 29/513; H01L 21/823821; H01L 21/823871
See application file for complete search history.

(56) References Cited

U.S. PATENT DOCUMENTS

| 5,712,180 | A | 1/1998 | Guterman et al. |
| 6,579,762 | B2 | 6/2003 | Io |

(Continued)

FOREIGN PATENT DOCUMENTS

JP      2011238745      11/2011

OTHER PUBLICATIONS

"Semiconductor Device and Method for Fabricating Same" Specification, Drawings, Claims and Prosecution History, of U.S. Appl. No. 14/165,930, filed Jan. 28, 2014, by Ju-Youn Kim, et al., which is stored in the United States Patent and Trademark Office (USPTO) Image File Wrapper (IFW) system.

*Primary Examiner* — William Coleman
(74) *Attorney, Agent, or Firm* — Onello & Mello, LLP

(57) ABSTRACT

A semiconductor device includes a substrate including a first active region, a second active region and a field region between the first and second active regions, and a gate structure formed on the substrate to cross the first active region, the second active region and the field region. The gate structure includes a p type metal gate electrode and an n-type metal gate electrode directly contacting each other, the p-type metal gate electrode extends from the first active region less than half way toward the second active region.

20 Claims, 15 Drawing Sheets

(51) Int. Cl.
*H01L 21/8238* (2006.01)
*H01L 29/49* (2006.01)
*H01L 29/51* (2006.01)

(56) References Cited

U.S. PATENT DOCUMENTS

| | | | |
|---|---|---|---|
| 6,878,579 B2 * | 4/2005 | Ohuchi | H01L 21/2807 257/151 |
| 7,297,583 B2 | 11/2007 | Chen et al. | |
| 7,315,067 B2 | 1/2008 | Wang | |
| 7,671,401 B2 | 3/2010 | Fang et al. | |
| 7,675,097 B2 * | 3/2010 | Adkisson et al. | 257/292 |
| 8,110,465 B2 * | 2/2012 | Zhu | H01L 21/28105 257/315 |
| 8,853,022 B2 | 10/2014 | Zhang | |
| 2008/0029805 A1 * | 2/2008 | Shimamoto | H01L 21/28282 257/315 |
| 2008/0096334 A1 | 4/2008 | Kobayashi | |
| 2008/0169512 A1 | 7/2008 | Doyle et al. | |
| 2009/0072312 A1 | 3/2009 | Chang et al. | |
| 2009/0170267 A1 | 7/2009 | Shah et al. | |
| 2010/0159684 A1 | 6/2010 | Chang et al. | |
| 2011/0163385 A1 | 7/2011 | Chidambarrao et al. | |
| 2011/0210403 A1 | 9/2011 | Teo et al. | |
| 2012/0074475 A1 | 3/2012 | Chew et al. | |
| 2012/0129304 A1 | 5/2012 | Nowak | |
| 2012/0139053 A1 | 6/2012 | Ando et al. | |
| 2012/0292715 A1 | 11/2012 | Hong et al. | |
| 2013/0015534 A1 | 1/2013 | Cheng et al. | |
| 2013/0093012 A1 | 4/2013 | Zhang et al. | |

* cited by examiner

HIGH-INTEGRATION SEMICONDUCTOR DEVICE AND METHOD FOR FABRICATING THE SAME

CROSS-REFERENCE TO RELATED APPLICATION

This application is a continuation of U.S. patent application Ser. No. 14/165,930, filed on Jan. 28, 2014, which claims priority from Korean Patent Application No. 10-2013-0082936 filed on Jul. 15, 2013 in the Korean Intellectual Property Office, and all the benefits accruing therefrom under 35 U.S.C. 119, the contents of which in its entirety are herein incorporated by reference.

BACKGROUND

1. Field

Exemplary embodiments of inventive concepts relate to a semiconductor device and a method for fabricating the same.

2. Related Art

As semiconductor manufacturers reduce geometries of semiconductor devices in order to continue providing more functionality and performance in smaller and smaller packages, reduced features sizes may affect the performance of the semiconductor devices. For example, the dimensions of a MOS device's gate region may be reduced and, consequentially, the distance between source and drain regions formed at opposite sides of the gate region will be reduced. Such a reduction may affect various performance characteristics such a device.

SUMMARY

Exemplary embodiments in accordance with principles of inventive concepts include a semiconductor device including a substrate including a first active region, a second active region and a field region between and directly contacting the first and second active regions; and a gate structure formed on the substrate to cross the first active region, the second active region and the field region, wherein the gate structure includes a p-type metal gate electrode and an n-type metal gate electrode directly contacting each other, wherein the p-type metal gate electrode is formed on the first active region and the n-type metal gate electrode is formed on the second active region, and wherein the contact surface between the p-type metal gate electrode and the n-type metal gate electrode is closer to the first active region than to the second active region.

Exemplary embodiments in accordance with principles of inventive concepts include a semiconductor device, wherein the field region has a center line equidistantly spaced apart from the first active region and the second active region, and the p-type metal gate electrode does not extend to the center line.

Exemplary embodiments in accordance with principles of inventive concepts include a semiconductor device of claim 1, wherein the p-type metal gate electrode includes a p-type work function adjusting layer, a first lower metal gate electrode and a first upper metal gate electrode, sequentially formed one on another, and the n-type metal gate electrode includes a second lower metal gate electrode and a second upper metal gate electrode sequentially formed one on the other, but not including the p-type work function adjusting layer.

Exemplary embodiments in accordance with principles of inventive concepts include a semiconductor device wherein the contact surface is defined by the p-type work function adjusting layer.

Exemplary embodiments in accordance with principles of inventive concepts include semiconductor device wherein the first lower gate electrode and the second lower gate electrode are in direct contact with one another, and the first upper gate electrode and the second upper gate electrode are in direct contact with one another.

Exemplary embodiments in accordance with principles of inventive concepts include semiconductor device including an interlayer dielectric layer formed on the substrate and including a trench intersecting the first active region, the field region and the second active region, wherein the first lower gate electrode and the second lower gate electrode are formed along sidewalls and a bottom surface of the trench.

Exemplary embodiments in accordance with principles of inventive concepts include a semiconductor device wherein the first lower gate electrode and the second lower gate electrode are separated from each other by the p-type work function adjusting layer.

Exemplary embodiments in accordance with principles of inventive concepts include a semiconductor device wherein the substrate is a silicon substrate, and a silicon germanium channel layer is provided between the first active region and the p-type metal gate electrode.

Exemplary embodiments in accordance with principles of inventive concepts include a semiconductor device wherein the first active region is a pull-up transistor forming region of a static random access memory (SRAM) and the second active region is a pull-down transistor forming region of an SRAM.

Exemplary embodiments in accordance with principles of inventive concepts include a semiconductor device wherein the first active region and the second active region are a first fin type active pattern and a second fin type active pattern, respectively.

Exemplary embodiments in accordance with principles of inventive concepts include a semiconductor device including a substrate including a first active region, a second active region and a field region between and directly contacting the first and second active regions; an interlayer dielectric layer formed on the substrate, including a trench intersecting the first active region, the field region and the second active region; and a gate structure formed in the trench to intersect the first active region, the second active region and the field region and having a top surface coplanarly formed with the interlayer dielectric layer, wherein the gate structure includes a p type metal gate electrode and an n-type metal gate electrode directly contacting each other, and a contact surface formed between the p-type metal gate electrode and the n-type metal gate electrode wherein the p-type metal gate electrode is formed on the first active region and the n-type metal gate electrode is formed on the second active region, and wherein a first width ranging from the contact surface to the first active region is less than a second width ranging from the contact surface to the second active region.

Exemplary embodiments in accordance with principles of inventive concepts include a semiconductor device wherein the p-type metal gate electrode and the n-type metal gate electrode are in direct contact with one another.

Exemplary embodiments in accordance with principles of inventive concepts include a semiconductor device wherein the field region has a center line equidistantly spaced apart from the first active region and the second active region, and the contact surface is positioned between the center line and the first active region.

Exemplary embodiments in accordance with principles of inventive concepts include a semiconductor device wherein the p-type metal gate electrode includes a p-type work function adjusting layer, a first lower metal gate electrode and a first upper metal gate electrode, sequentially formed one on another, and the n-type metal gate electrode includes a second lower metal gate electrode and a second upper metal gate electrode sequentially formed one on the other, but not including the p-type work function adjusting layer.

Exemplary embodiments in accordance with principles of inventive concepts include a semiconductor device comprising a gate dielectric layer formed between the substrate and the p-type metal gate electrode and between the substrate and the n-type metal gate electrode, and the gate dielectric layer is formed along a bottom surface of the trench, but not formed on sidewalls of the trench.

Exemplary embodiments in accordance with principles of inventive concepts include a semiconductor device wherein the p-type work function adjusting layer has a first part formed along the gate dielectric layer and a second part extending in a direction normal to the substrate and formed on the field region, and the second part of the p-type work function adjusting layer is interposed between the first lower gate electrode and the second lower gate electrode.

Exemplary embodiments in accordance with principles of inventive concepts include a semiconductor device comprising a gate dielectric layer formed between the substrate and the p-type metal gate electrode and between the substrate and the n-type metal gate electrode, and the gate dielectric layer is formed along sidewalls and a bottom surface of the trench.

Exemplary embodiments in accordance with principles of inventive concepts include a semiconductor device wherein the p-type work function adjusting layer includes at least one of TiN and TaN.

Exemplary embodiments in accordance with principles of inventive concepts include semiconductor device including a first fin type active pattern; a second fin type active pattern adjacent to the first fin type active pattern; an isolation layer formed between and making direct contact with the first fin type active pattern and the second fin type active pattern; and a gate structure intersecting the first fin type active pattern, the isolation layer and the second fin type active pattern, wherein the gate structure includes a p-type metal gate electrode and an n-type metal gate electrode directly contacting each other wherein the p-type metal gate electrode is formed on the first fin type active pattern, and the n-type metal gate electrode is formed on the second fin type active pattern, and wherein a contact surface between the p-type metal gate electrode and the n-type metal gate electrode is closer to the first fin type active pattern than to the second fin type active pattern.

Exemplary embodiments in accordance with principles of inventive concepts include a semiconductor device wherein the p-type metal gate electrode includes a p-type work function adjusting layer, a first lower metal gate electrode and a first upper metal gate electrode, sequentially formed one on another, and the n-type metal gate electrode includes a second lower metal gate electrode and a second upper metal gate electrode sequentially formed one on the other, but not including the p-type work function adjusting layer, and the contact surface is defined by the p-type work function adjusting layer.

Exemplary embodiments in accordance with principles of inventive concepts include a semiconductor device wherein the first lower gate electrode and the second lower gate electrode are in direct contact with one another, and the first upper gate electrode and the second upper gate electrode are in direct contact with one another.

Exemplary embodiments in accordance with principles of inventive concepts include a semiconductor device wherein the first lower gate electrode and the second lower gate electrode are separated from each other by the p-type work function adjusting layer.

Exemplary embodiments in accordance with principles of inventive concepts include a semiconductor device wherein the first fin type active pattern is a silicon element semiconductor, and a silicon germanium channel layer is provided between the first fin type active pattern and the p-type metal gate electrode, wherein the silicon germanium channel layer is formed along at least a portion of the first fin type active pattern.

Exemplary embodiments in accordance with principles of inventive concepts include a semiconductor device wherein the first fin type active pattern includes at least one of a silicon germanium layer and a germanium layer.

Exemplary embodiments in accordance with principles of inventive concepts include a semiconductor device wherein the second fin type active pattern includes a group III-V compound semiconductor layer.

Exemplary embodiments in accordance with principles of inventive concepts include a semiconductor device including a gate structure formed over sequentially arranged first active, field, and second active regions in a substrate; and a p-type metal gate electrode in the gate structure extending from over the first active region less than half way toward the second active region.

Exemplary embodiments in accordance with principles of inventive concepts include a semiconductor device including an n-type metal gate electrode in the gate structure extending from over the second active region to greater than half way toward the first active region.

Exemplary embodiments in accordance with principles of inventive concepts include semiconductor device including a gate structure formed over sequentially arranged first active, field, and second active regions in a substrate; a p-type metal gate electrode in the gate structure extending from over the first active region; and an n-type metal gate electrode in the gate structure extending from over the second active region, the n-type and p-type metal gate electrodes arranged to increase the threshold voltage of the semiconductor device.

Exemplary embodiments in accordance with principles of inventive concepts include a semiconductor device wherein the p-type metal gate structure extends over the first active region less than half way toward the second active region and the n-type metal gate electrode in the gate structure extends more than half way towards the first active region.

Exemplary embodiments in accordance with principles of inventive concepts include a memory device including a semiconductor device including a gate structure formed over sequentially arranged first active, field, and second active regions in a substrate; a p-type metal gate electrode in the gate structure extending from over the first active region; and an n-type metal gate electrode in the gate structure extending from over the second active region, the n-type and p-type metal gate electrodes arranged to increase the threshold voltage of the semiconductor device.

Exemplary embodiments in accordance with principles of inventive concepts include a portable electronic device including a semiconductor device including a gate structure formed over sequentially arranged first active, field, and second active regions in a substrate; a p-type metal gate electrode in the gate structure extending from over the first active region; and an n-type metal gate electrode in the gate structure extending from over the second active region, the n-type and p-type metal gate electrodes arranged to increase the threshold voltage of the semiconductor device.

Exemplary embodiments in accordance with principles of inventive concepts include a memory cellular telephone including a semiconductor device including a gate structure formed over sequentially arranged first active, field, and second active regions in a substrate; a p-type metal gate electrode in the gate structure extending from over the first active region; and an n-type metal gate electrode in the gate structure extending from over the second active region, the n-type and p-type metal gate electrodes arranged to increase the threshold voltage of the semiconductor device.

BRIEF DESCRIPTION OF THE DRAWINGS

The above and other features and advantages of exemplary embodiments of inventive concepts will become more apparent by describing in detail preferred embodiments thereof with reference to the attached drawings in which.

DESCRIPTION

Figure 1:
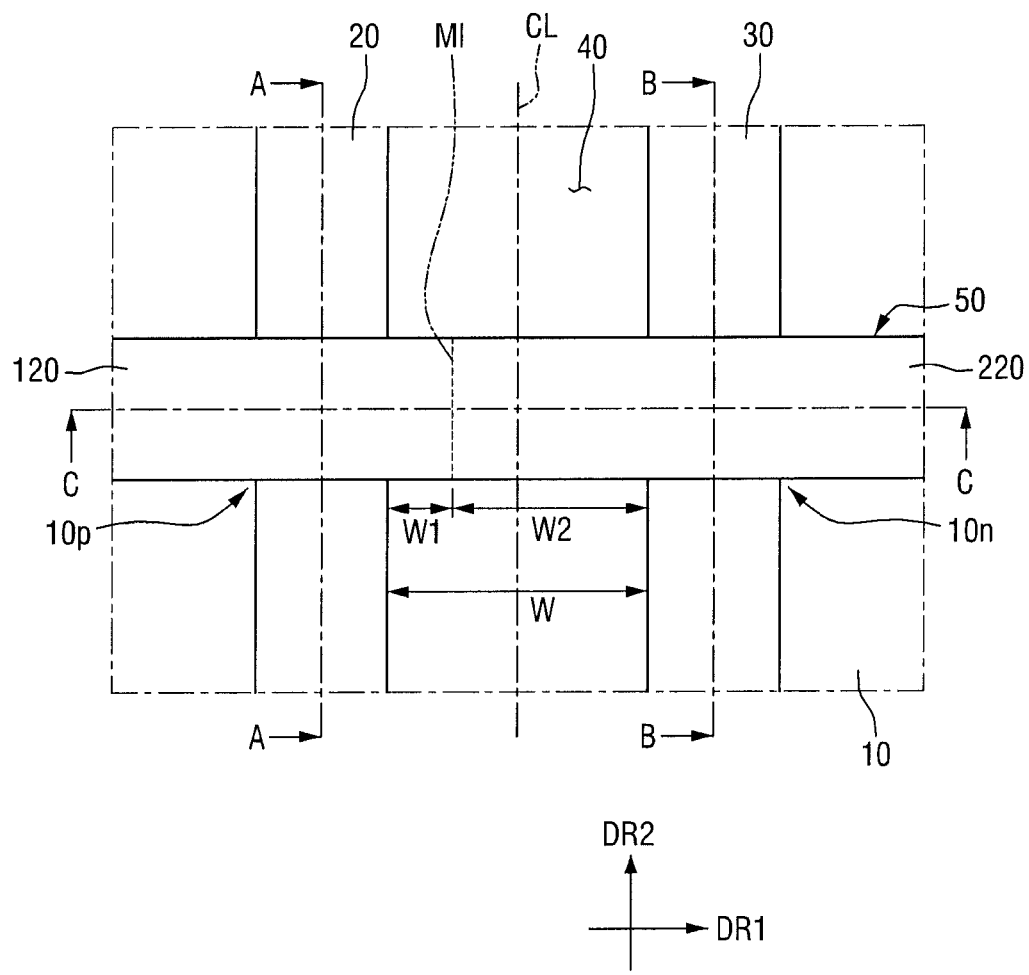
FIG. 1 is a plan view illustrating semiconductor devices according to first to fourth exemplary embodiments of inventive concepts.

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough, and will convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. The term "or" is used in an inclusive sense unless otherwise indicated.

It will be understood that, although the terms first, second, third, for example. may be used herein to describe various elements, components, regions, layers and/or sections, these elements, components, regions, layers and/or sections should not be limited by these terms. These terms are only used to distinguish one element, component, region, layer or section from another region, layer or section. In this manner, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. In this manner, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. In this manner, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In this manner, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments in accordance with principles of inventive concepts will be explained in detail with reference to the accompanying drawings.

FIG. 1 is a plan view illustrating semiconductor devices according to first to fourth exemplary embodiments in accordance with principles of inventive concepts. FIGS. 2 through 5 are cross-sectional views of semiconductor devices according to first through fourth exemplary embodiments of inventive concepts, respectively.

Referring to FIG. 1, each of the semiconductor devices 1 to 4 includes a substrate 10 including a first active region 20, a second active region 30, a field region 40, and a gate structure 50 intersecting the first active region 20, the second active region 30 and the field region 40.

The substrate 10 may be bulk silicon or a silicon-on-insulator (SOI), for example, or may be a silicon substrate, or a substrate made of other materials selected from the group consisting of for example, germanium, silicon germanium, indium antimonide, lead telluride compound, indium arsenide, indium phosphide, gallium arsenide, and gallium antimonide, but inventive concepts are not limited thereto.

The first active region 20 and the second active region 30 may be defined by the field region 40. The first active region 20 and the second active region 30 are spatially separated from each other by the field region 40. First and second active regions (for example, 20, 30) may be referred to herein as being "adjacent" one another. Active regions are adjacent in the sense that, although field region 40 lies between them (and they are, therefore, not adjacent in the sense that they abut one another), no active pattern lies between them. In exemplary embodiments in accordance with principles of inventive concepts, first active region 20 and second active region 30 are of a rectangular shape elongate in a second direction DR2. The first active region 20 and the second active region 30 are arranged in parallel to each other in long side directions.

The first active region 20 is a PMOS forming region and the second active region 30 is an NMOS forming region. The first active region 20 may be implemented as a pull up transistor of SRAM and the second active region 30 may be implemented as a pull down transistor or a pass transistor of SRAM, for example. In exemplary embodiments in accordance with principles of inventive concepts, first active region 20 and second active region 30 may be PMOS and NMOS forming regions, to which a gate voltage may be applied by one gate structure.

The first active region 20 and the second active region 30 may be fin type active patterns, for example, which will be described in greater detail in the discussion related to FIGS. 6 through 10.

The field region 40 may be formed to surround the first active region 20 and the second active region 30, for example, or may be a portion positioned between the first active region 20 and the second active region 30, for example.

The field region 40 is disposed between the first active region 20 and the second active region 30 while making direct contact with the first active region 20 and the second active region 30. That is, in exemplary embodiments in accordance with principles of inventive concepts, no active region intervenes between the field region 40 and the first active region 20 and between the field region 40 and the second active region 30.

The field region 40 may include, for example, at least one of a silicon oxide layer, a silicon nitride layer, a silicon oxynitride layer, or combinations thereof.

The width of the field region 40 positioned between the first active region 20 and the second active region 30 may be denoted by W and may have a center line CL equidistantly spaced apart from the first active region 20 and the second active region 30. That is, in exemplary embodiments in accordance with principles of inventive concepts, the distance between the center line CL and the first active region 20 and the distance between the center line CL and the second active region 30 may be equal, at half the width of the field region 40. The center line CL of the field region 40 may be parallel to the elongate direction of the first active region 20 and the second active region 30.

In exemplary embodiments in accordance with principles of inventive concepts, gate structure 50 may be formed on the substrate 10 to intersect the first active region 20, the second active region 30 and the field region 40. The gate structure 50 may extend lengthwise in a first direction DR1.

In exemplary embodiments in accordance with principles of inventive concepts, gate structure 50 includes a first metal gate electrode 120 and a second metal gate electrode 220. The first metal gate electrode 120 and the second metal gate electrode 220 may directly contact each other. The first metal gate electrode 120 is a p-type metal gate electrode, which is formed on the first active region 20. The second metal gate electrode 220 is an n-type metal gate electrode, which is formed on the second active region 30. That is, a PMOS 10$p$ (also referred to herein as a PMOS transistor) is formed at an intersection of the first active region 20 and the gate structure 50, and an NMOS 10$n$ (also referred to herein as an NMOS transistor) is formed at an intersection of the second active region 30 and the gate structure 50.

Because, in exemplary embodiments in accordance with principles of inventive concepts, the first metal gate electrode 120 extends on the field region 40, it may overlap with the first active region 20 and a portion of the field region 40. Because the second metal gate electrode 220 directly contacts the first metal gate electrode 120, it may overlap the second active region 30 and the portion of the field region 40 not overlapping with the first metal gate electrode 120.

In exemplary embodiments in accordance with principles of inventive concepts, gate structure 50 includes a contact surface MI contacting the first metal gate electrode 120 and the second metal gate electrode 220. The contact surface MI of the first metal gate electrode 120 and the second metal gate electrode 220 is positioned on the field region 40. The contact surface MI positioned between the first metal gate electrode 120 and the second metal gate electrode 220 is positioned closer to the first active region 20 than to the second active region 30. Because, in exemplary embodiments in accordance with principles of inventive concepts, the first active region 20, the contact surface MI, the center line CL and the second active region 30 are arranged in that order, the first metal gate electrode 120 may not overlap with the center line CL of the field region 40. That is, the contact surface MI is positioned between the first active region 20 and the center line CL of the field region 40.

A portion of the first metal gate electrode 120 extending on the field region 40 has a first width W1. That is, the first width W1 refers to the width of the first metal gate electrode 120 ranging from the contact surface MI to the first active region 20. A portion of the second metal gate electrode 220 extending on the field region 40 has a second width W2. That is, the second width W2 refers to the width of the second metal gate electrode 220 ranging from the contact surface MI to the second active region 30. Because, in exemplary embodiments in accordance with principles of inventive concepts, the contact surface MI between the first metal gate electrode 120 and the second metal gate electrode 220 is closer to the first active region 20 than to the second active region 30, the second width W2 is greater than the first width W1.

Because, in exemplary embodiments in accordance with principles of inventive concepts, the first metal gate electrode 120 and the second metal gate electrode 220 directly contact each other, the sum of the width W1 of the first metal gate electrode 120 overlapping the field region 40 and the width W2 of the second metal gate electrode 220 overlapping the field region 40 may be equal to the width W of the field region 40.

Next, a semiconductor device according to the first exemplary embodiment in accordance with principles of inventive concepts will be described with reference to FIGS. 1 and 2.

Figure 2:
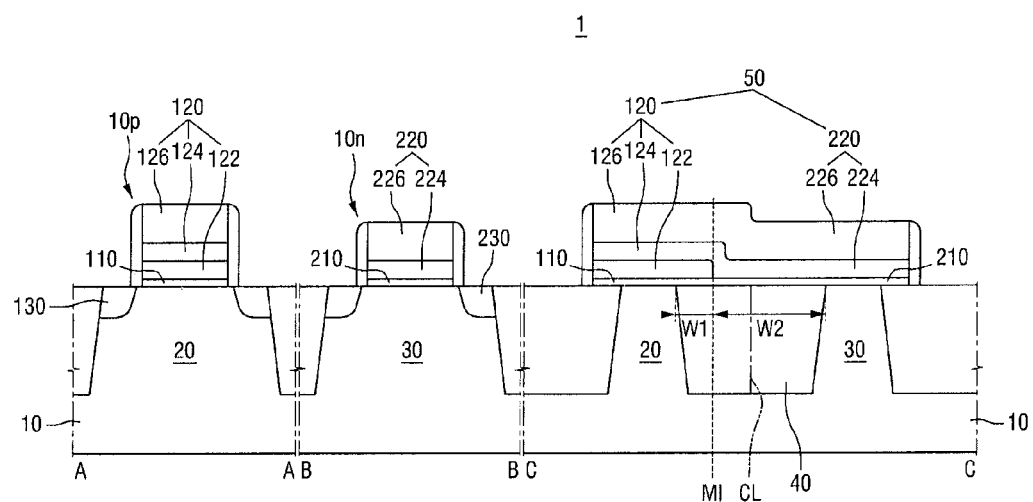
FIG. 2 is a cross-sectional view illustrating the semiconductor device according to the first embodiment of inventive concepts.

FIG. 2 is a cross-sectional view illustrating a semiconductor device according to the first exemplary embodiment of in accordance with principles of inventive concepts, taken along lines A-A, B-B and C-C of FIG. 1.

Referring to FIGS. 1 and 2, the semiconductor device 1 includes the substrate 10, the gate dielectric layers 110 and 210 and the gate structure 50.

The substrate 10 includes the first active region 20, the second active region 30 and the field region 40 positioned between the first active region 20 and the second active region 30. The field region 40 makes direct contact with the first active region 20 and the second active region 30.

The gate dielectric layers 110 and 210 are formed on the substrate. The gate dielectric layers 110 and 210 may include the first gate dielectric layer 110 and the second gate dielectric layer 210. The first gate dielectric layer 110 is formed on the first active region 20 and the second gate dielectric layer 210 is formed on the second active region 30. The first gate dielectric layer 110 and the second gate dielectric layer 210 may be defined by the contact surface MI of the gate structure 50. The first gate dielectric layer 110 and the second gate dielectric layer 210 are formed on the same level. By, "formed on the same level" we mean that two elements are formed by the same fabrication process, or process step.

Each of the first and second gate dielectric layers 110 and 210 may include a high-k layer, and examples thereof may include, but are not limited to, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate structure 50, including the first metal gate electrode 120 and the second metal gate electrode 220 directly contacting each other, are formed on the gate dielectric layers 110 and 210. The first metal gate electrode 120 includes the p-type work function adjusting layer 122, the first lower metal gate electrode 124 and the first upper metal gate electrode 126, which are sequentially formed on the first gate dielectric layer 110. The second metal gate electrode 220 includes the second lower metal gate electrode 224 and the second upper metal gate electrode 226, which are sequentially formed on the second gate dielectric layer 210. In this exemplary embodiment in accordance with principles of inventive concepts, the second metal gate electrode 220 does not include the p-type work function adjusting layer 122.

Because the first metal gate electrode 120 includes the p-type work function adjusting layer 122 but the second metal gate electrode 220 does not include the p-type work function adjusting layer 122, the contact surface MI between the first metal gate electrode 120 and the second metal gate electrode 220 is defined by the p-type work function adjusting layer 122. That is, when the gate structure 50 is cut along a normal of the substrate 10 up to an end of the p-type work function adjusting layer 122 extending on the field region 40, the contact surface MI is formed between the first metal gate electrode 120 and the second metal gate electrode 220.

Because the contact surface MI between the first metal gate electrode 120 and the second metal gate electrode 220 is closer to the first active region 20 than to the second active region 30, the p-type work function adjusting layer 122 does not overlap with the center line CL of the field region 40.

The p-type work function adjusting layer 122 extending on the field region 40 while intersecting the first active region 20 may overlap with a portion of the field region 40, and an overlapping width between the p-type work function adjusting layer 122 and the field region 40 corresponds to the first width W1 and, as a result, a non-overlapping width between the p-type work function adjusting layer 122 and the field region 40 corresponds to the second width W2, obtained by subtracting the first width W1 from the width W of the field region 40.

Because an interlayer dielectric layer covering the gate structure 50 is formed after forming the gate structure 50, a height of the first metal gate electrode 120 on the first active region 20 is greater than that of the second metal gate electrode 220 on the second active region 30 second metal gate electrode 220. The difference between the heights of the first metal gate electrode 120 and the second metal gate electrode 220 is substantially equal to thickness of the p-type work function adjusting layer 122.

In exemplary embodiments in accordance with principles of inventive concepts, first lower metal gate electrode 124 and the second lower metal gate electrode 224 are directly connected to each other and the first upper metal gate electrode 126 and the second upper metal gate electrode 226 are directly connected to each other. In addition, the first lower metal gate electrode 124 and the second lower metal gate electrode 224 are formed on the same level, and the first upper metal gate electrode 126 and the second upper metal gate electrode 226 are also formed on the same level.

Because the first lower metal gate electrode 124 and the second lower metal gate electrode 224 are directly connected to each other, portions of the first lower metal gate electrode 124 and the second lower metal gate electrode 224 extend onto the field region 40. Because the contact surface MI is defined by the p-type work function adjusting layer 122, the width W1 of the first lower metal gate electrode 124 extending onto the field region 40 is smaller than the width W2 of the second lower metal gate electrode 224 extending onto the field region 40.

The p-type work function adjusting layer 122 may include, for example, at least one of TiN, TaC, TaN and TaCN. The first lower metal gate electrode 124 and the second lower metal gate electrode 224 may include, for example, at least one of TiN, TaN, TaC, TaCN, TiAl, and TiAlC, and the first upper metal gate electrode 126 and the second upper metal gate electrode 226 may include, for example, at least one of Al and W.

A first source/drain 130 may be formed at each side of the first metal gate electrode 120, and a second source/drain 230 may be formed at each side of the second metal gate electrode 220. In exemplary embodiments in accordance with principles of inventive concepts, embodiment, the first source/drain 130 and the second source/drain 230 are formed in the first active region 20 and the second active region 30, respectively, but aspects of inventive concepts are not limited thereto. That is, the first source/drain 130 and the second source/drain 230 may protrude from a top surface of the substrate 10, for example.

The semiconductor device 2 according to the second exemplary embodiment in accordance with principles of inventive concepts will now be described with reference to FIGS. 1 and 3. The following description will focus on differences between the first and second exemplary embodiments in accordance with principles of inventive concepts.

Figure 3:
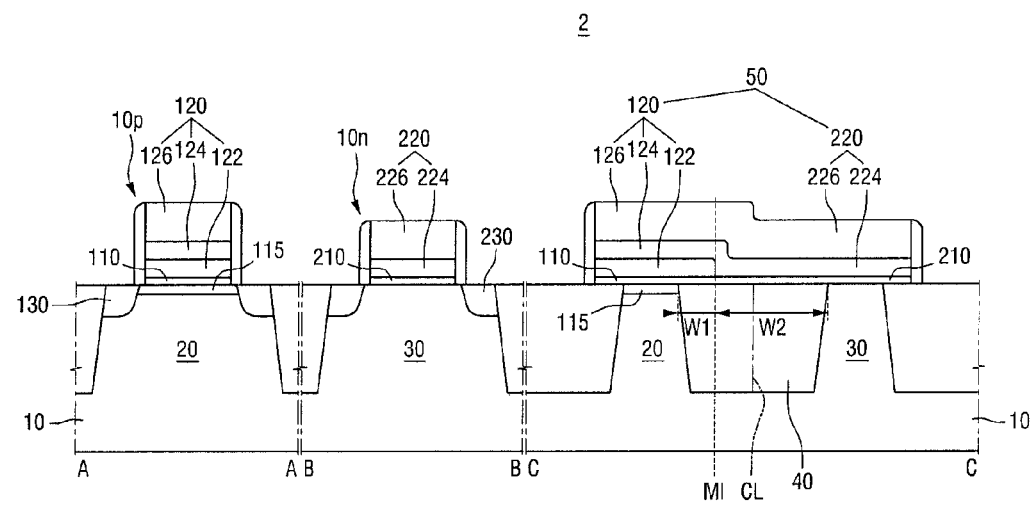
FIG. 3 is a cross-sectional view illustrating the semiconductor device according to the second embodiment of inventive concepts.

FIG. 3 is a cross-sectional view illustrating the semiconductor device according to the second exemplary embodiment in accordance with principles of inventive concepts, taken along lines A-A, B-B and C-C of FIG. 1.

Referring to FIG. 3, the semiconductor device 2 according to the second exemplary embodiment in accordance with principles of inventive concepts further includes a channel layer 115 formed between the first active region 20 and the first metal gate electrode 120. In detail, the channel layer 115 is formed between the first active region 20 and the first gate dielectric layer 110.

The channel layer 115 may include a material for forming the first active region 20, that is, a different material from the substrate 10. Since the PMOS 10*p* is formed at the intersection of the first active region 20 and the first metal gate electrode 120, the channel layer 115 may include a material capable of improving mobility of holes.

In order to improve the mobility of holes in the channel layer 115, the channel layer 115 may be subjected to compressive stress applied from the first active region 20. For example, the channel layer 115 may include a material having a greater lattice constant than the first active region 20 in order to apply such stress.

In the semiconductor device 2 according to the second exemplary embodiment in accordance with principles of inventive concepts, the substrate 10 may be a silicon substrate. Because the substrate 10 is a silicon substrate, the first active region 20 may also include silicon. Therefore, the channel layer 115 may include silicon germanium (SiGe) having a greater lattice constant than silicon (Si). That is, in exemplary embodiments in accordance with principles of inventive concepts, the channel layer 115 may be a silicon germanium channel layer.

Hereinafter, the semiconductor device 3 according to the third exemplary embodiment in accordance with principles of inventive concepts will be described with reference to FIGS. 1 and 4. The following description will focus on differences between the first and third exemplary embodiments.

Figure 4:
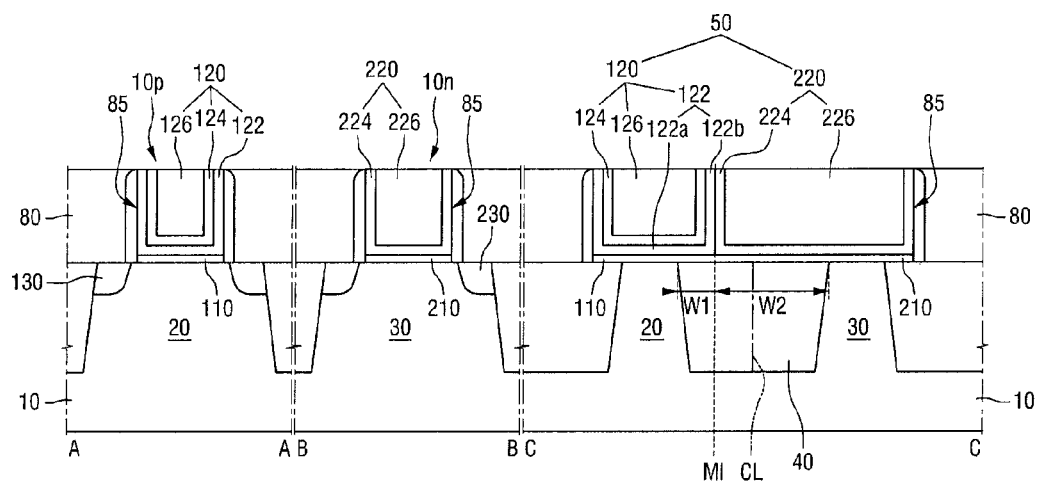
FIG. 4 is a cross-sectional view illustrating the semiconductor device according to the third embodiment of inventive concepts.

FIG. 4 is a cross-sectional view illustrating the semiconductor device according to the third exemplary embodiment, taken along lines A-A, B-B and C-C of FIG. 1.

Referring to FIG. 4, the semiconductor device 3 according to the third exemplary embodiment is formed on the substrate 10 and further includes an interlayer dielectric layer 80 including a trench 85.

The trench 85 intersects the first active region 20, the field region 40 and the second active region 30. The first gate dielectric layer 110 and the second gate dielectric layer 210 are formed on a bottom surface of the trench 85. However, the first gate dielectric layer 110 and the second gate dielectric layer 210 are not formed on sidewalls of the trench 85.

The interlayer dielectric layer 80 may include, for example, at least one of a low-k material, oxide, nitride, and oxynitride. The low-k material may include, for example, may include flowable oxide (FOX), tonen silazene (TOXZ), undoped silicate glass (USG), borosilicate glass (BSG), phosphosilicate glass (PSG), borophosphosilicate glass (BPSG), plasma-enhanced tetraethylorthosilicate (PE-TEOS), fluorosilicate glass (FSG), high density plasma (HDP) oxide, plasma enhanced oxide (PEOX), flowable CVD (FCVD), and combinations thereof.

The gate structure 50 may be formed in the interlayer dielectric layer 80 by filling the trench 85. A top surface of the gate structure 50 formed in the trench 85 is coplanar with the interlayer dielectric layer 80. The first metal gate electrode 120 may be formed by filling a first part (85*a* of FIG. 17) of the trench 85, and the second metal gate electrode 220 may be formed by filling a second part (85*b* of FIG. 17) of the trench 85. The second metal gate electrode 220 does not include the p-type work function adjusting layer 122.

The first lower metal gate electrode 124 and the second lower metal gate electrode 224 are separated from each other by the p-type work function adjusting layer 122, and the first upper metal gate electrode 126 and the second upper metal gate electrode 226 are also separated from each other.

The p-type work function adjusting layer 122 may include a first part 122*a*, a second part 122*b* and a third part, which are connected to one another. The first part 122*a* of the p-type work function adjusting layer 122 may be formed along the bottom surface of the trench 85, that is, along the substrate 10 and the first gate dielectric layer 110, the third part of the p-type work function adjusting layer 122 may be formed along sidewalls of the trench 85, and the second part 122*b* of the p-type work function adjusting layer 122 extending in a normal direction of the substrate 10 may be formed on the field region 40. That is, the second part 122*b* of the p-type work function adjusting layer 122 is not foamed along the sidewalls and bottom surface of the trench 85 and protrudes from a given portion MI of the bottom surface of the trench 85 overlapping with the field region 40. The second part 122*b* of the p-type work function adjusting layer 122 protrudes in the normal direction of the substrate 10 between the first active region 20 and the second active region 30.

The first lower metal gate electrode 124 and the second lower metal gate electrode 224 are separated from each other by the second part 122*b* of the p-type work function adjusting layer 122. That is, the second part 122*b* of the p-type work function adjusting layer 122 is interposed between the first lower metal gate electrode 124 and the second lower metal gate electrode 224. Likewise, the first upper metal gate electrode 126 and the second upper metal gate electrode 226 are separated from each other by the second part 122b of the p-type work function adjusting layer 122. Although the first lower metal gate electrode 124 and the second lower metal gate electrode 224 are separated from each other by the p-type work function adjusting layer 122, because the p-type work function adjusting layer 122 includes a conductive material, the first lower metal gate electrode 124 and the second lower metal gate electrode 224 are electrically connected to each other.

In the semiconductor device 3 according to the third exemplary embodiment, the contact surface MI between the first metal gate electrode 120 and the second metal gate electrode 220 is defined by the second part 122b of the p-type work function adjusting layer 122.

The first lower metal gate electrode 124 may be formed along the p-type work function adjusting layer 122, and the first upper metal gate electrode 126 may be formed by filling a space defined by the first lower metal gate electrode 124. The second lower metal gate electrode 224 may be formed along the sidewalls and bottom surface of the trench 85 and the second part 122b of the p-type work function adjusting layer 122, and the second upper metal gate electrode 226 may be formed by filling a space defined by the second lower metal gate electrode 224.

The semiconductor device 4 according to the fourth exemplary embodiment will now be described with reference to FIGS. 1 and 5. The following description will focus on differences between the first and fifth exemplary embodiments in accordance with principles of inventive concepts.

Figure 5:
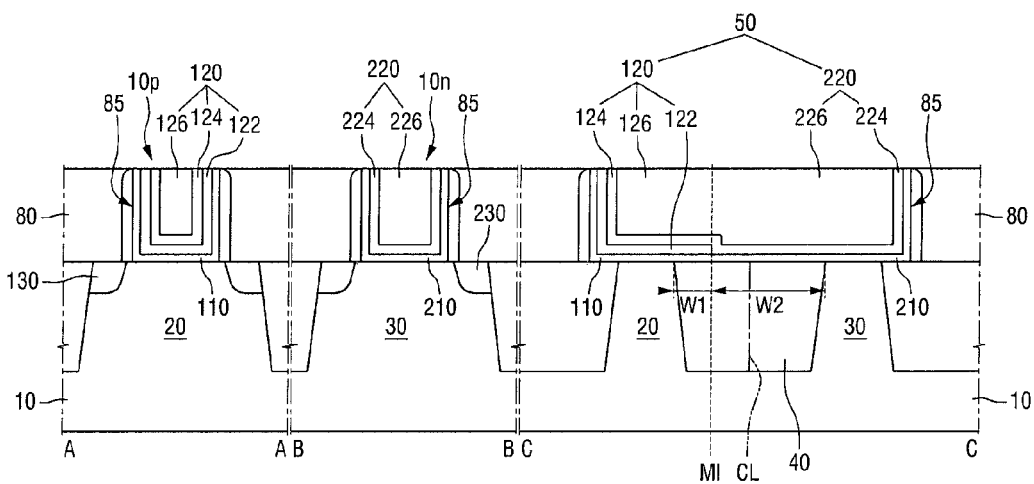
FIG. 5 is a cross-sectional view illustrating the semiconductor device according to the fifth embodiment of inventive concepts.

FIG. 5 is a cross-sectional view illustrating the semiconductor device according to the fifth exemplary embodiment, taken along lines A-A, B-B and C-C of FIG. 1.

Referring to FIG. 5, the gate dielectric layers 110 and 210 are formed along the sidewalls and bottom surface of the trench 85. That is, the first gate dielectric layer 110 formed between the substrate 10 and the first metal gate electrode 120 and the second gate dielectric layer 210 formed between the substrate 10 and the second metal gate electrode 220 are formed along the sidewalls and bottom surface of the trench 85.

The p-type work function adjusting layer 122 is generally formed along the sidewalls and bottom surface of the trench 85, that is, along the first gate dielectric layer 110, and extends in the normal direction of the substrate 10 while not including a portion formed on the field region 40. Therefore, the first lower metal gate electrode 124 and the second lower metal gate electrode 224 are formed along the sidewalls and bottom surface of the trench 85 to then be directly connected to each other.

The first upper metal gate electrode 126 and the second upper metal gate electrode 226 are formed by filling the trench 85 to then be directly connected to each other.

Next, a semiconductor device according to a fifth exemplary embodiment will be described with reference to FIGS. 6 and 7.

Figure 6:
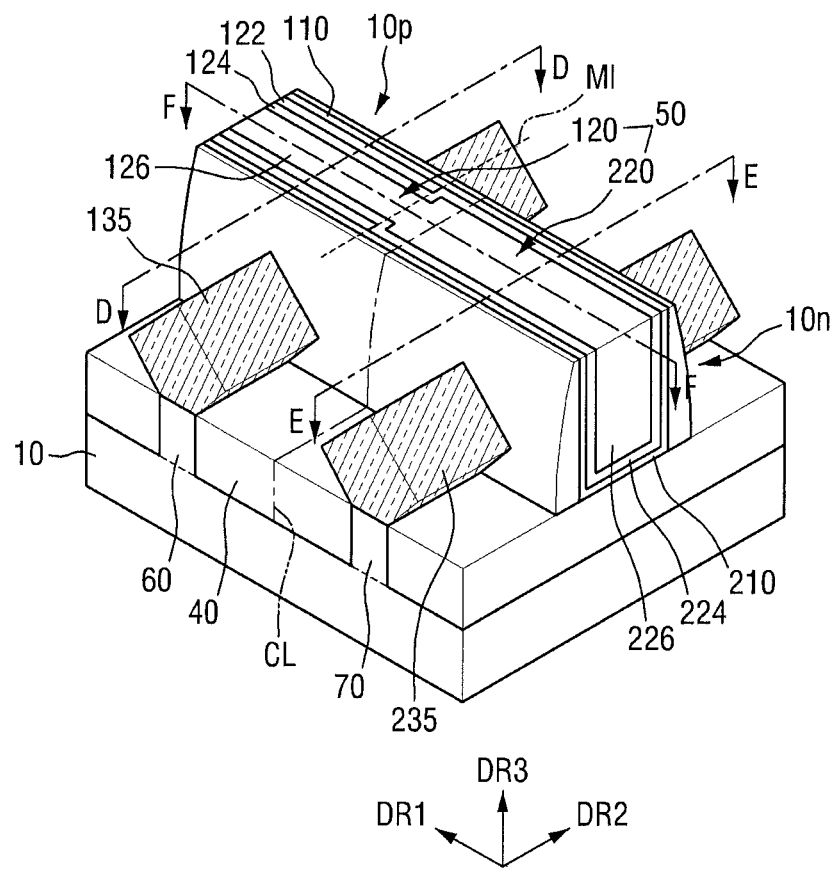
FIG. 6 is a perspective view illustrating semiconductor devices according to fifth and sixth embodiments of inventive concepts.
Figure 7:
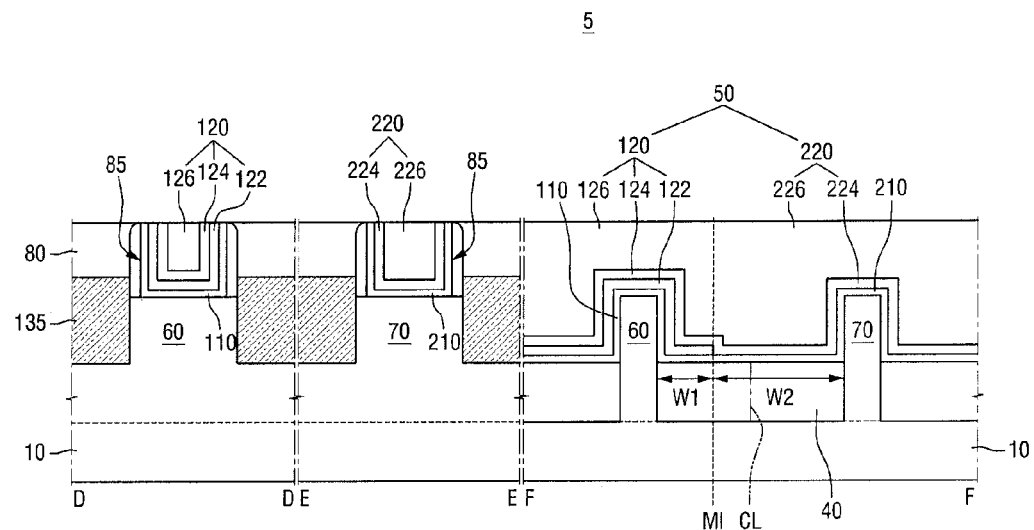
FIG. 7 is a cross-sectional view illustrating the semiconductor device according to the fifth embodiment of inventive concepts.

FIG. 6 is a perspective view illustrating semiconductor devices according to fifth and sixth exemplary embodiments in accordance with principles of inventive concepts, and FIG. 7 is a cross-sectional view illustrating the semiconductor device according to the fifth exemplary embodiment, taken along lines D-D, E-E and F-F of FIG. 6. For brevity and clarity of explanation, an interlayer dielectric layer 80 is not illustrated in FIG. 6.

The first fin type active pattern 60 and the second fin type active pattern 70 shown in FIG. 6 correspond to the first active region and the second active region 30 shown in FIG. 1, and explanations thereof will not be repeated in detail here.

Referring to FIGS. 6 and 7, the semiconductor device according to the fifth exemplary embodiment may include a substrate 10, a first fin type active pattern 60, a second fin type active pattern 70, a gate structure 50, a first elevated source/drain 135, a second elevated source/drain 235 and an interlayer dielectric layer 80.

The first fin type active pattern 60 and the second fin type active pattern 70 are adjacent to each other, in the sense that, although field region 40 lies between them (and they are, therefore, not adjacent in that sense), no active pattern lies between them, and may extend in parallel lengthwise in the second direction DR2. The first fin type active pattern 60 and the second fin type active pattern 70 may be portions of the substrate 10 and may include an epitaxial layer grown from the substrate 10.

In exemplary embodiments in accordance with principles of inventive concepts, first fin type active pattern 60 is a PMOS forming region and the second fin type active pattern 70 is an NMOS forming region. When the first fin type active pattern 60 and the second fin type active pattern 70 include the epitaxial layer grown from the substrate 10, the first fin type active pattern 60 and the second fin type active pattern 70 may include a single element semiconductor, such as silicon or germanium. Alternatively, the first fin type active pattern 60 and the second fin type active pattern 70 may include a compound semiconductor, for example, a group IV-IV compound semiconductor or a group III-V compound semiconductor. In exemplary embodiments in accordance with principles of inventive concepts, the group IV-IV compound semiconductor may be, for example, a binary compound or a ternary compound including at least two elements of carbon (C), silicon (Si), germanium (Ge), and tin (Sn) or a compound doped with a IV group element. The group III-V compound semiconductor may include, for example, a binary compound, a ternary compound or a quaternary compound, prepared by combining at least one group III element of aluminum (Al), gallium (Ga) and indium (In) with at least one group V element of phosphorus (P), arsenic (As) and antimony (Sb).

The field region 40 may be formed between the first fin type active pattern 60 and the second fin type active pattern 70 while making direct contact with the first fin type active pattern 60 and the second fin type active pattern 70. Additionally, the field region 40 may be formed in contact with portions of the first fin type active pattern 60 and the second fin type active pattern 70. That is, the first fin type active pattern 60 and the second fin type active pattern 70 may protrude from the field region 40. Because the field region 40 electrically disconnects a device formed on the first fin type active pattern 60 from a device formed on the second fin type active pattern 70, it may be an isolation layer.

The gate structure 50 may be formed to intersect the first fin type active pattern 60, the field region 40 and the second fin type active pattern 70. The gate structure 50 may extend in the first direction DR1. In exemplary embodiments in accordance with principles of inventive concepts, gate structure 50 includes a first metal gate electrode 120 as a p-type metal gate electrode formed on the first fin type active pattern 60, and a second metal gate electrode 220 as an n-type metal gate electrode formed on the second fin type active pattern 70. The first metal gate electrode 120 and the second metal gate electrode 220 directly contact each other.

A p type FINFET 10p may be formed at an intersection of the first fin type active pattern 60 and the gate structure 50, and an n type FINFET 10n may be formed at an intersection of the second fin type active pattern 70 and the gate structure 50.

In exemplary embodiments in accordance with principles of inventive concepts, first metal gate electrode 120 includes a p-type work function adjusting layer 122 and a first lower metal gate electrode 124 sequentially formed along the first fin type active pattern 60 protruding from the field region 40, and a first upper metal gate electrode 126 filling a portion of a trench 85. The second metal gate electrode 220 includes a second lower metal gate electrode 224 formed along the first fin type active pattern 60 protruding from the field region 40 and a second upper metal gate electrode 226 filling the rest portion of the trench 85. However, in exemplary embodiments, the second metal gate electrode 220 does not include the p-type work function adjusting layer 122.

The first lower metal gate electrode 124 formed along the first fin type active pattern 60 and the second lower metal gate electrode 224 formed along the second fin type active pattern 70 extend onto the field region 40 to then be directly connected to each other. In addition, the first upper metal gate electrode 126 and the second upper metal gate electrode 226 are also directly connected to each other.

The contact surface MI between the first metal gate electrode 120 and the second metal gate electrode 220 may be defined by the p-type work function adjusting layer 122 of the first metal gate electrode 120. An overlapping width of the p-type work function adjusting layer 122 and the field region 40 is a first width W1 and a non-overlapping width of the p-type work function adjusting layer 122 and the field region 40 is a second width W2, which is greater than the first width W1. Therefore, the contact surface MI between the first metal gate electrode 120 and the second metal gate electrode 220 is positioned closer to the first fin type active pattern 60 than to the second fin type active pattern 70.

That is, the overlapping width W1 of the first metal gate electrode 120 and the field region 40 is smaller than the overlapping width W2 of the second metal gate electrode 220 and the field region 40. Therefore, the first metal gate electrode 120 does not overlap with the center line CL of the field region 40 equidistantly spaced apart from the first fin type active pattern 60 and the second fin type active pattern 70.

The first gate dielectric layer 110 and the second gate dielectric layer 210 may be formed between the gate structure 50 and the first fin type active pattern 60 and between the gate structure 50 and the second fin type active pattern 70. The first gate dielectric layer 110 and the second gate dielectric layer 210 may be defined by the contact surface MI and may be formed on the field region 40 between the first fin type active pattern 60 and the second fin type active pattern 70. The first gate dielectric layer 110 and the second gate dielectric layer 210 may include a high-k dielectric layer.

The first elevated source/drain 135 may be formed on the first fin type active pattern 60 at both sides of the gate structure 50. Because a PMOS transistor is formed on the first fin type active pattern 60, the first elevated source/drain 135 may include a compressive stress material. For example, when the first fin type active pattern 60 includes silicon, the compressive stress material may be a material having a greater lattice constant than silicon (Si), e.g., SiGe.

The second elevated source/drain 235 may be formed on the second fin type active pattern 70 at both sides of the gate structure 50. Because an NMOS transistor is formed on the first fin type active pattern 60, the second elevated source/drain 235 may include the same material as the second fin type active pattern 70, or a tensile stress material. For example, when the second fin type active pattern 70 includes silicon, the second elevated source/drain 235 may be silicon or a material having a smaller lattice constant than silicon (Si), e.g., SiC.

The first elevated source/drain 135 and the second elevated source/drain 235 may have various shapes. For example, the first elevated source/drain 135 and the second elevated source/drain 235 may have the shape of a diamond, a circle, or a rectangle. In FIG. 6, the first elevated source/drain 135 and the second elevated source/drain 235 shaped are of a diamond (or a pentagon or a hexagon) shape.

Hereinafter, the semiconductor device according to the sixth exemplary embodiment in accordance with principles of inventive concepts will be described with reference to FIGS. 6 and 8. The following description will focus on differences between the fifth and sixth exemplary embodiments.

Figure 8:
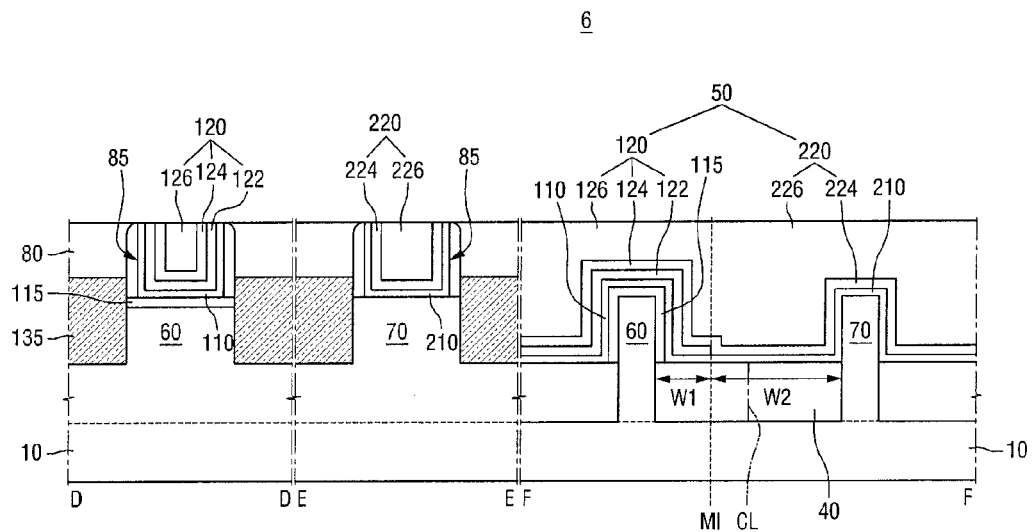
FIG. 8 is a cross-sectional view illustrating the semiconductor device according to the sixth embodiment of inventive concepts.

FIG. 8 is a cross-sectional view illustrating the semiconductor device according to the sixth exemplary embodiment, taken along lines D-D, E-E and F-F of FIG. 6.

Referring to FIG. 8, the semiconductor device 6 according to the sixth exemplary embodiment further includes a channel layer 115 formed between a first fin type active pattern 60 and a first metal gate electrode 120.

The channel layer 115 may include a different material from a material for forming the first fin type active pattern 60. When the first fin type active pattern 60 is a silicon element semiconductor, the channel layer 115 may include a material having a greater lattice constant than silicon (Si). For example, the channel layer 115 may include silicon germanium (SiGe) having a greater lattice constant than silicon (Si). That is, in exemplary embodiments in accordance with principles of inventive concepts, the channel layer 115 may be a silicon germanium channel layer.

The channel layer 115 may be formed along at least a portion of the first fin type active pattern 60. For example, the channel layer 115 may be formed along the first fin type active pattern 60 protruding from the field region 40 and may extend only to the field region 40.

Hereinafter, a semiconductor device according to a seventh exemplary embodiment in accordance with principles of inventive concepts will be described with reference to FIGS. 9 and 10. The following description will focus on differences between the fifth and seventh exemplary embodiments.

Figure 9:
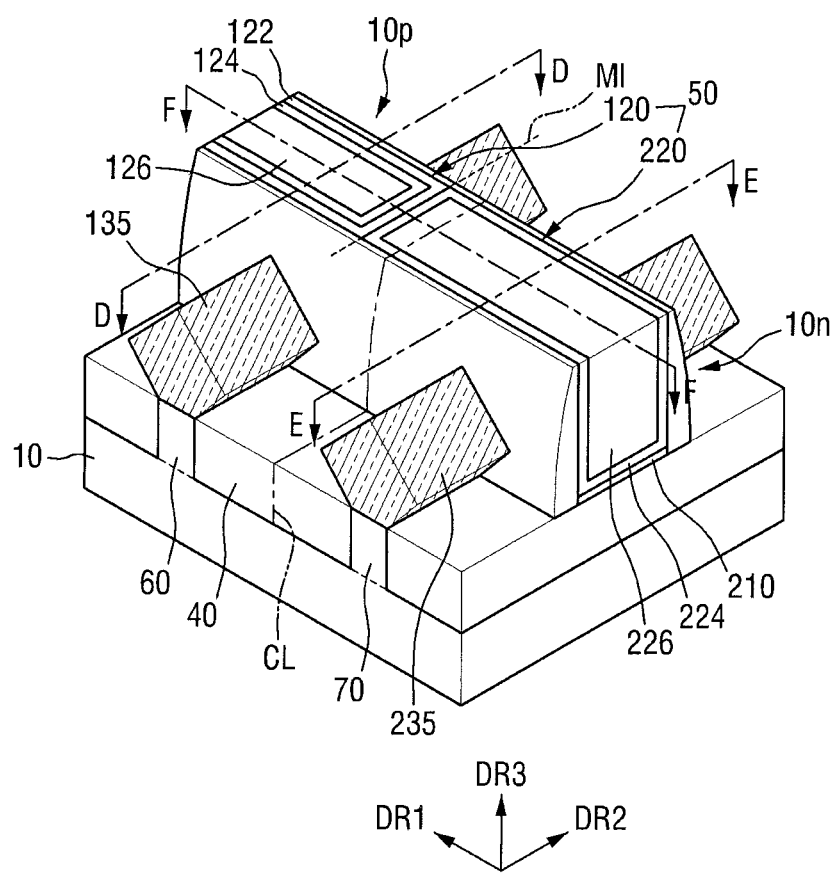
FIG. 9 is a perspective view illustrating a semiconductor device according to a seventh embodiment of inventive concepts.
Figure 10:
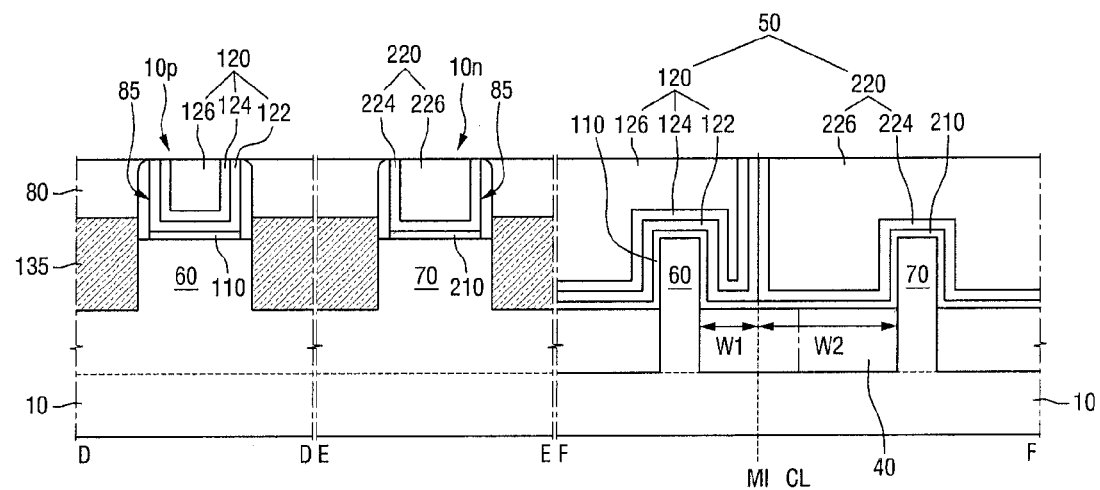
FIG. 10 is a cross-sectional view illustrating the semiconductor device according to the seventh embodiment of inventive concepts.

FIG. 9 is a perspective view illustrating a semiconductor device according to a seventh exemplary embodiment and FIG. 10 is a cross-sectional view illustrating the semiconductor device according to the seventh exemplary embodiment, taken along lines D-D, E-E and F-F of FIG. 9. For clarity and brevity of description, interlayer dielectric layer 80 is not illustrated in FIG. 9.

Referring to FIGS. 9 and 10, the first lower metal gate electrode 124 and the second lower metal gate electrode 224 are spatially separated from each other by the p-type work function adjusting layer 122. That is, a portion of the p-type work function adjusting layer 122 intervenes between the first lower metal gate electrode 124 and the second lower metal gate electrode 224.

The p-type work function adjusting layer 122 may be formed along portions of the first fin type active pattern 60 and the field region 40. The width of the p-type work function adjusting layer 122 extending onto the field region 40 is a first width W1. At a portion spaced the first width W1 apart from the first fin type active pattern 60, the p-type work function adjusting layer 122 includes a portion extending in a direction in which the first fin type active pattern 60 protrudes. That is to say, the p-type work function adjusting layer 122 includes a portion protruding from the field region 40 between the first fin type active pattern 60 and the second fin type active pattern 70. The first lower metal gate electrode 124 and the second lower metal gate electrode 224 are separated from each other by the protruding portion.

The p-type work function adjusting layer 122 becomes an isolation film between the first lower metal gate electrode 124 and the second lower metal gate electrode 224. Because the p-type work function adjusting layer 122 includes a conductive material, the first lower metal gate electrode 124 and the second lower metal gate electrode 224 are electrically connected to each other.

Figure 11:
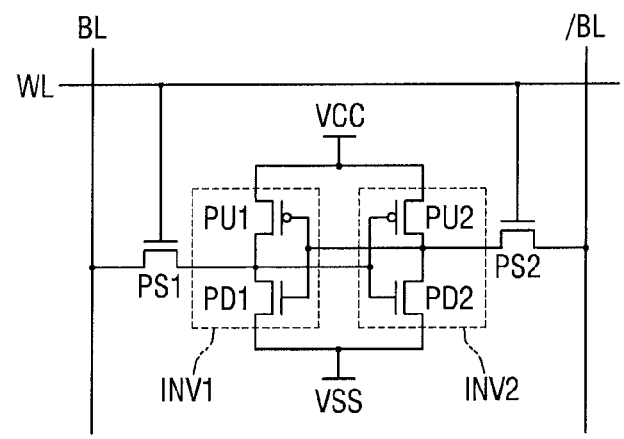
FIGS. 11 and 12 are a circuit view and a layout view illustrating a semiconductor device according to an eighth embodiment of inventive concepts.
Figure 12:
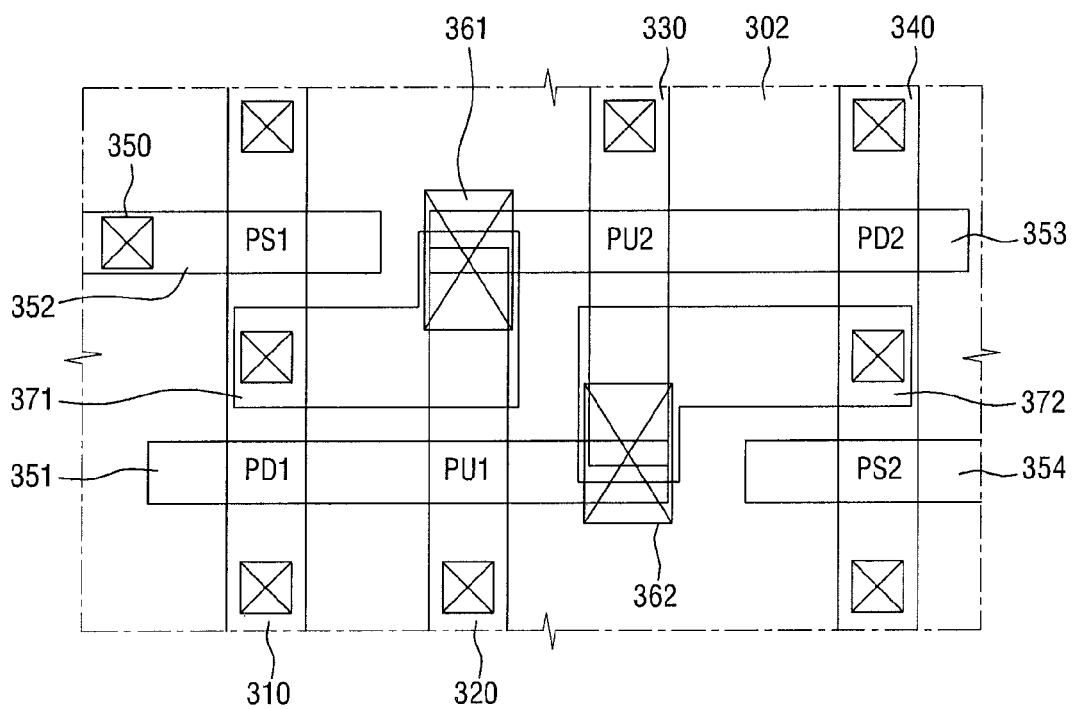

FIGS. 11 and 12 are a circuit view and a layout view illustrating a semiconductor device according to an eighth exemplary embodiment in accordance with principles of inventive concepts.

Referring to FIGS. 11 and 12, the semiconductor device 8 according to an eighth exemplary embodiment may include a pair of inverters INV1 and INV2 connected in parallel between a power supply node Vcc and a ground node Vss, and a first pass transistor PS1 and a second pass transistor PS2 connected to output nodes of the inverters INV1 and INV2. The first pass transistor PS1 and the second pass transistor PS2 may be connected to a bit line BL and a complementary bit line BLb. Gates of the first pass transistor PS 1 and the second pass transistor PS2 may be connected to a word line WL.

In exemplary embodiments in accordance with principles of inventive concepts, first inverter INV1 includes a first pull-up transistor PU1 and a first pull-down transistor PD1 connected in series to each other, and the second inverter INV2 includes a second pull-up transistor PU2 and a second pull-down transistor PD2 connected in series to each other. The first pull-up transistor PU1 and the second pull-up transistor PU2 may be PMOS transistors, and the first pull-down transistor PD1 and the second pull-down transistor PD2 may be NMOS transistors, for example.

In order to constitute a latch circuit, an input node of the first inverter INV1 may be connected to an output node of the second inverter INV2 and an input node of the second inverter INV2 may be connected to an output node of the first inverter INV1.

Referring to FIGS. 11 and 12, a third active region 310, a fourth active region 320, a fifth active region 330 and a sixth active region 340, which are spaced apart from one another, may extend lengthwise in a direction (e.g., in an up-and-down direction of FIG. 12). The fourth active region 320 and the fifth active region 310 may extend in smaller lengths than the third active region 310 and the sixth active region 340.

In addition, a first gate electrode 351, a second gate electrode 352, a third gate electrode 353, and a fourth gate electrode 354 are formed to extend in another direction (for example, in a left-and-right direction of FIG. 12) to intersect the third active region 310 to the sixth active region 340. In exemplary embodiments in accordance with principles of inventive concepts, the first gate electrode 351 completely intersects the third active region 310 and the fourth active region 320 (that is, first gate electrode 351 extends in full width completely across third and fourth active regions 310, 320) while partially overlapping with a terminal of the fifth active region 330. The third gate electrode 353 completely intersects the sixth active region 340 and the fifth active region 330 (that is, third gate electrode 353 extends in full width completely across fifth and sixth active regions 330, 340) while partially overlapping with a terminal of the fourth active region 320. The second gate electrode 352 and the fourth gate electrode 354 are formed to intersect the third active region 310 and the sixth active region 340, respectively.

In exemplary embodiments in accordance with principles of inventive concepts, the first pull-up transistor PU1 is defined in vicinity of an intersection of the first gate electrode 351 and the fourth active region 320, the first pull-down transistor PD1 is defined in vicinity of an intersection of the first gate electrode 351 and the third active region 310, and the first pass transistor PS1 is defined in vicinity of an intersection of the second gate electrode 352 and the third active region 310. The second pull-up transistor PU2 is defined in vicinity of an intersection of the third gate electrode 353 and the fifth active region 330, the second pull-down transistor PD2 is defined in vicinity of an intersection of the third gate electrode 353 and the sixth active region 340, and the second pass transistor PS2 is defined in vicinity of an intersection of the fourth gate electrode 354 and the sixth active region 340.

Although not specifically shown, sources/drains may be formed at opposite sides of the respective intersections of the first to fourth gate electrodes 351-354 and the third to sixth active regions 310, 320, 330 and 340.

In addition, a plurality of contacts 350 may be formed.

Additionally, a shared contact 361 concurrently connects the fourth active region 320, a third gate line 353 and a wire 371. A shared contact 362 may also concurrently connect the fifth active region 330, a first gate line 351 and a wire 372.

In exemplary embodiments in accordance with principles of inventive concepts, the first gate electrode 351 and the third gate electrode 353 may correspond to the gate structure 50 shown in FIGS. 1 to 10, the fourth active region 320 and the fifth active region 330 may correspond to the first active region 20 and the first fin type active pattern 60 shown in FIGS. 1 to 10, and the third active region 310 and the sixth active region 340 may correspond to the second active region 30 and the second fin type active pattern 70 shown in FIGS. 1 to 10.

Figure 13:
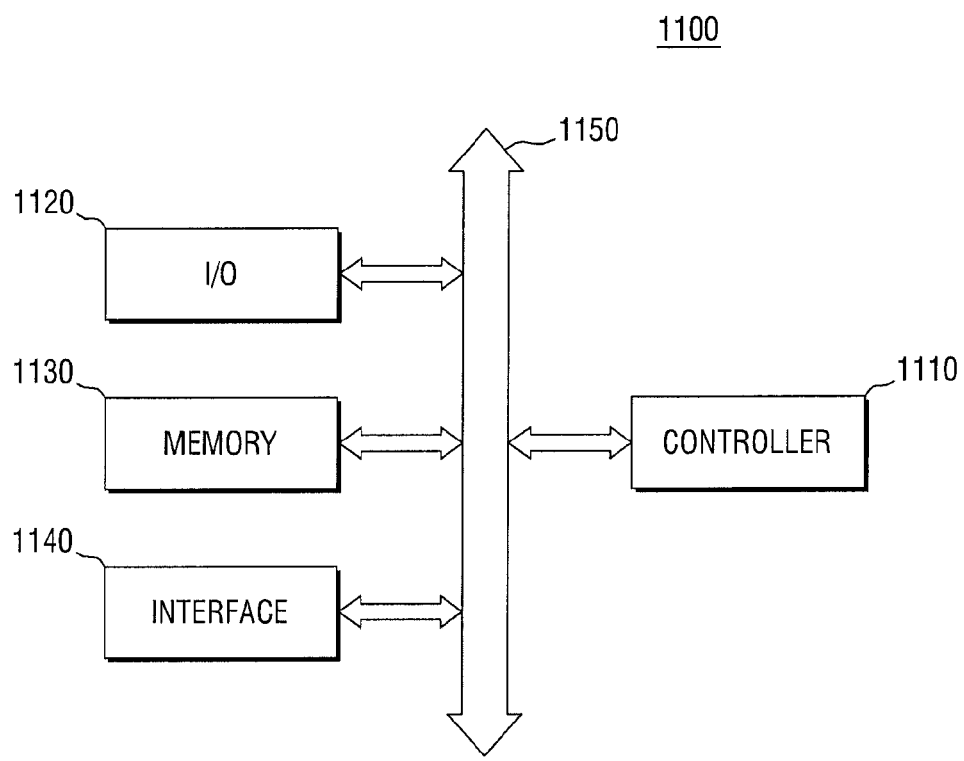
FIG. 13 is a block diagram of an electronic system including semiconductor devices according to some embodiments of inventive concepts.

FIG. 13 is a block diagram of an electronic system including a semiconductor device in accordance with principles of inventive concepts.

Electronic system 1100 may include a controller 1110, an input/output device (I/O) 1120, a memory 1130, an interface 1140 and a bus 1150. The controller 1110, the I/O 1120, the memory 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a keypad, a keyboard, a display device, and so on. The memory 1130 may store data and/or commands The interface 1140 may perform functions of transmitting data to a communication network or receiving data from the communication network. The interface 1140 may be wired or wireless. For example, the interface 1140 may include an antenna or a wired/wireless transceiver, and so on. Although not shown, the electronic system 1100 may further include high-speed DRAM and/or SRAM as working memory for improving the operation of the controller 1110. A semiconductor device in accordance with principles of inventive concepts may be provided in the memory 1130 or may be provided some components of the controller 1110 or the I/O 1120, for example.

The electronic system 1100 may be applied to a portable electronic device, such as a personal digital assistant (PDA), a portable computer, a web tablet, a wireless phone, a mobile phone, a digital music player, a memory card, or any type of electronic device capable of transmitting and/or receiving information in a wireless environment.

Figure 14:
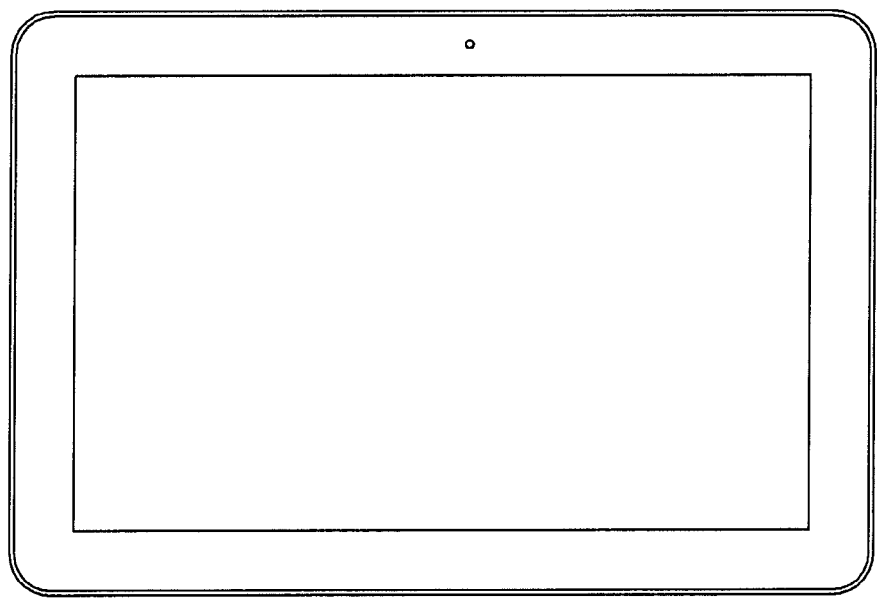
FIGS. 14 and 15 illustrate an exemplary semiconductor system to which semiconductor devices according to some embodiments of inventive concepts can be employed.
Figure 15:
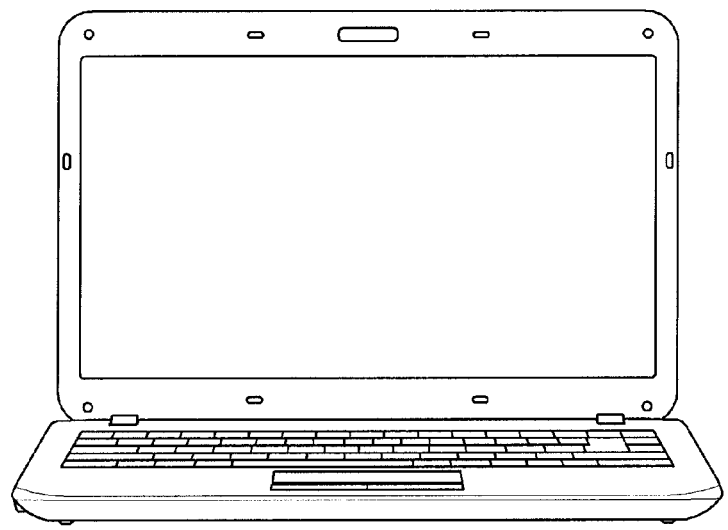

FIGS. 14 and 15 illustrate an exemplary semiconductor system to which a semiconductor device in accordance with principles of inventive concepts can be employed. FIG. 14 illustrates an example in which a semiconductor device in accordance with principles of inventive concepts is applied to a tablet PC, and FIG. 15 illustrates an example in which a semiconductor device in accordance with principles of inventive concepts is applied to a notebook computer. Semiconductor devices in accordance with principles of inventive concepts may also be applied to other IC devices not illustrated herein.

Hereinafter, a method for fabricating the semiconductor device according to the third exemplary embodiment in accordance with principles of inventive concepts will be described with reference to FIGS. 1, 4 and 16 to 21.

FIGS. 16 to 21 illustrate intermediate process steps in a method for fabricating the semiconductor device according to the third exemplary embodiment in accordance with principles of inventive concepts.

Figure 16:
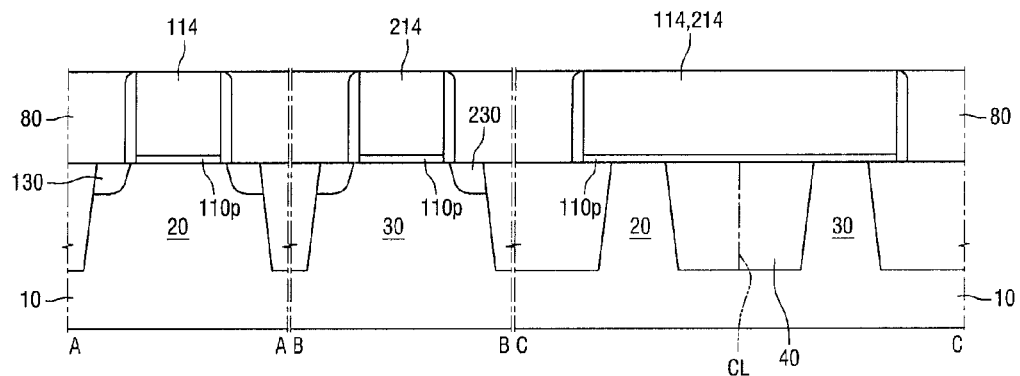
FIGS. 16 to 21 illustrate intermediate process steps in a method for fabricating the semiconductor device according to the third embodiment of inventive concepts.

Referring to FIGS. 1 and 16, a substrate 10 is provided, the substrate 10 including a first active region 20, a second active region 30, and a field region 40. The field region 40 is positioned between the first active region 20 and the second active region 30 while making direct contact with the first active region 20 and the second active region 30. The field region 40 has a center line CL equidistantly spaced apart from the first active region 20 and the second active region 30.

The field region 40 may be formed as a shallow trench isolation (STI), but aspects of inventive concepts are not limited thereto.

Because, in this exemplary embodiment, the first active region 20 is a PMOS forming region and the second active region 30 is an NMOS forming region, n-type impurity and p-type impurity may be doped into the first active region 20 and the second active region 30, respectively, to implement PMOS and NMOS.

A pre-gate dielectric layer 110p and the dummy gate structures 114 and 214 intersecting the first active region 20, the field region 40 and the second active region 30 are formed on the substrate 10. Because the pre-gate dielectric layer 110p and the dummy gate structures 114 and 214 are formed by the same patterning process, the pre-gate dielectric layer 110p is formed along a top surface of the substrate 10.

The dummy gate structures 114 and 214 include a first dummy gate electrode 114 intersecting the first active region 20, and a second dummy gate electrode 214 intersecting the second active region 30.

The pre-gate dielectric layer 110p may include, for example, one of a silicon oxide (SiO$_2$) layer, a silicon oxynitride (SiON) layer and a combination thereof, or a high-k dielectric layer, for example. The method for fabricating the semiconductor device according to the third exemplary embodiment will be described with regard to a case in which the pre-gate dielectric layer 110p includes a high-k dielectric layer.

The dummy gate structures 114 and 214 may include, for example, silicon. In exemplary embodiments in accordance with principles of inventive concepts, the dummy gate structures 114 and 214 may include one of polycrystalline silicon (poly Si), amorphous silicon (a-Si) and a combination thereof. The first dummy gate electrode 117 may be undoped or may be doped with a similar impurity.

After forming the pre-gate dielectric layer 110p and the dummy gate structures 114 and 214, a first source/drain 130 may be formed at both sides of the first dummy gate electrode 114, and a second source/drain 230 may be formed at both sides of the second dummy gate electrode 214.

Next, an interlayer dielectric layer 80 may be formed on the substrate 10, the interlayer dielectric layer 80 covering the dummy gate structures 114 and 214, the first active region 20, the field region 40 and the second active region 30. The interlayer dielectric layer 80 may include, for example, at least one of a low-k material layer, an oxide layer, a nitride layer, and an oxynitride layer.

Next, the interlayer dielectric layer 80 may be planarized to expose top surfaces of the dummy gate structures 114 and 214. In the planarizing, a chemical mechanical polishing (CMP) process may be used, for example.

Figure 17:
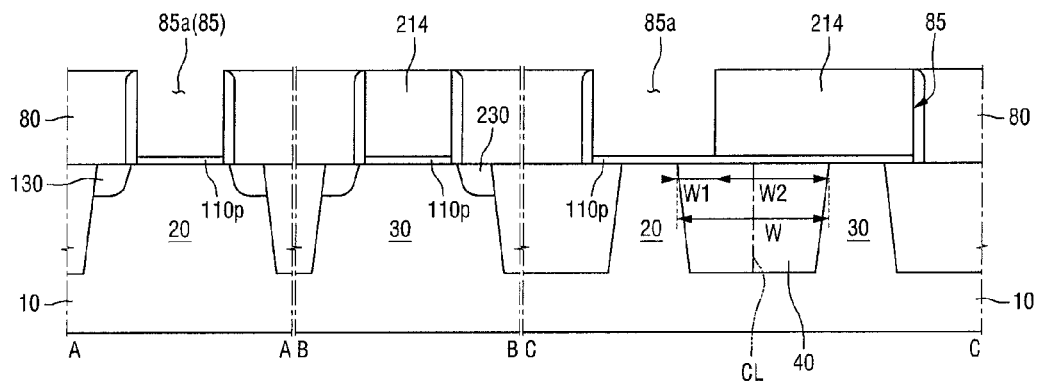

Referring to FIG. 17, a first part 85a of the trench 85 intersecting a portion of the field region 40 and the first active region 20 may be formed in the interlayer dielectric layer 80 by removing the first dummy gate electrode 114. The field region 40 and the first active region 20 are not exposed by the first part 85a of the trench 85.

The first part 85a of the trench 85 is part of the trench 85 intersecting the field region 40 and the second active region 30, that is, the part overlapping the portion of the field region 40 and the first active region 20.

One of sidewalls of the first part 85a of the trench 85 corresponds to the second dummy gate electrode 214.

A width of the first part 85a of the trench 85 overlapping with the field region 40 corresponds to the first width W1. Therefore, an overlapping width between the second dummy gate electrode 214 and the field region 40 corresponds to the second width W2. The sum of the first width W1 and the second width W2 is equal to a width W of the field region 40.

Because the width W1 of the first part 85a of the trench 85 overlapping with the field region 40 is smaller than the width W1 of the second dummy gate electrode 214 overlapping with the field region 40, the first part 85a of the trench 85 may not overlap with, that is, may not reach, the center line CL of the field region 40.

The first dummy gate electrode 114 may be removed by etching, for example, by dry etching.

Figure 18:
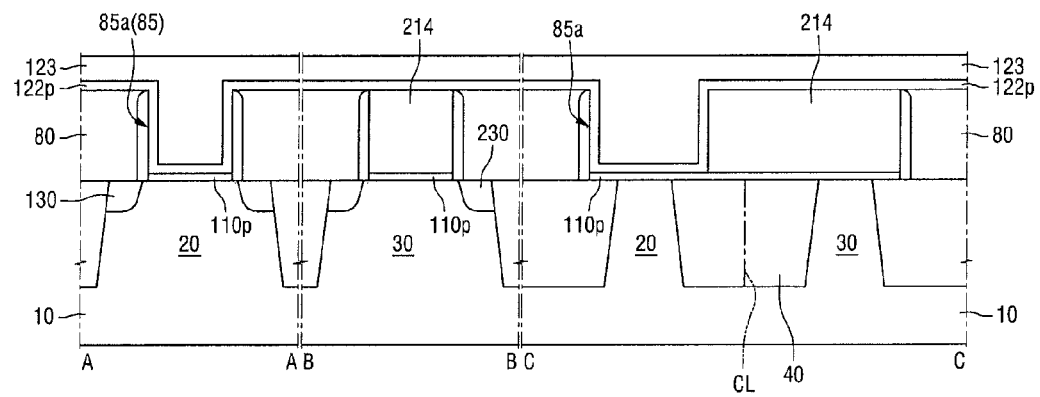

Referring to FIG. 18, a conductive layer 122p may be formed along a top surface of the interlayer dielectric layer 80, sidewalls and a bottom surface of the first part 85a of the trench 85 and a top surface of the second dummy gate electrode 214. That is, the conductive layer 122p covers the first active region 20, the second active region 30 and the field region 40.

The conductive layer 122p may include at least one of a TiN layer and a TaN layer, and may be formed by, for example, chemical vapor deposition (CVD) or atomic layer deposition (ALD), for example.

Next, a sacrificial layer 123 may be formed to fill the first part 85a of the trench 85 having the conductive layer 122p. The sacrificial layer 123 may also be formed on the interlayer dielectric layer 80 and the second dummy gate electrode 214 while filling the first part 85a of the trench 85. The sacrificial layer 123 may include a material having good gap-fill capability.

Figure 19:
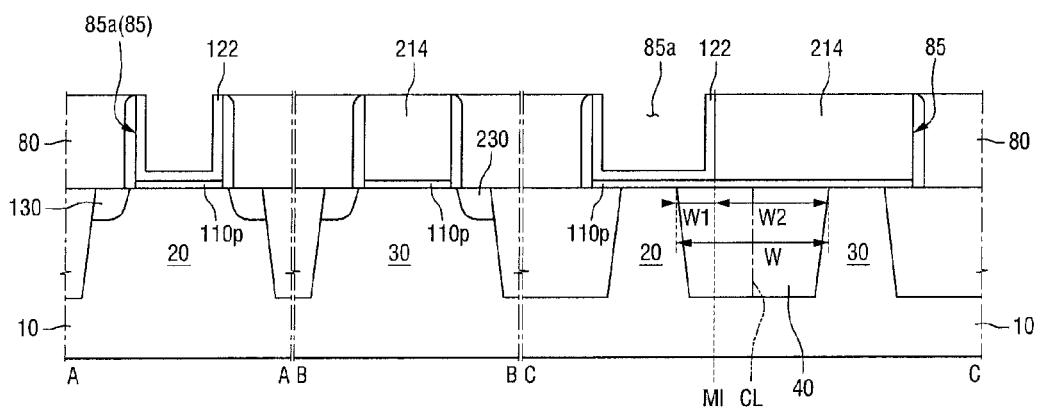

Referring to FIG. 19, the sacrificial layer 123 and the conductive layer 122p are planarized to expose a top surface of the interlayer dielectric layer 80 and a top surface of the second dummy gate electrode 214. As the result, a p-type work function adjusting layer 122 may be formed along the sidewalls and bottom surface of the first part 85a of the trench 85.

The p-type work function adjusting layer 122 may be formed by removing a portion of the field region 40, the portion having the second width W2 and a portion of the conductive layer 122p overlapping with the second active region 30.

The p-type work function adjusting layer 122 formed on the pre-gate dielectric layer 110p extends onto the field region 40 while intersecting the first active region 20. An overlapping width between the p-type work function adjusting layer 122 and the field region 40 is equal to the first width W1 of the first part 85a of the trench 85 overlapping with the field region 40. Therefore, the p-type work function adjusting layer 122 may not overlap with, that is, may not reach, the center line CL of the field region 40.

After forming the p-type work function adjusting layer 122, the rest portion of the sacrificial layer 123 filling the first part 85a of the trench 85 may be removed.

Figure 20:
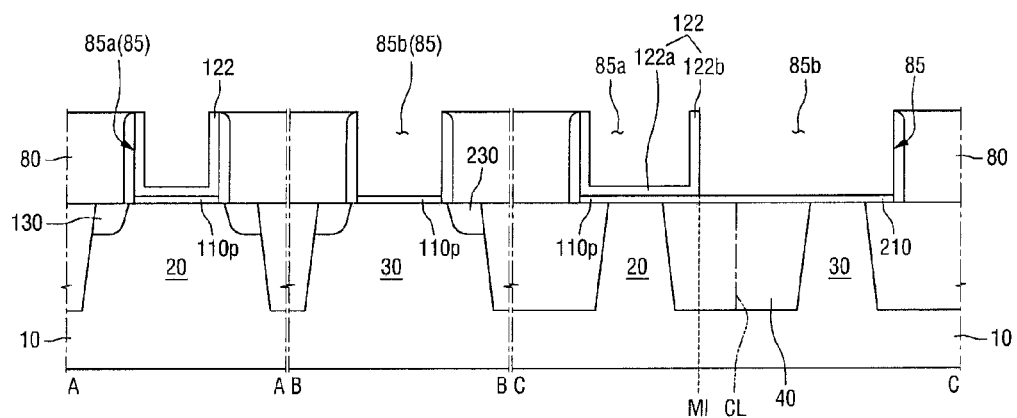

Referring to FIG. 20, the second part 85b of the trench 85 positioned in vicinity of the first part 85a of the trench 85 may be formed in the interlayer dielectric layer 80 by removing the second dummy gate electrode 214. The second part 85b of the trench 85 intersects the remaining portion of the field region 40 not overlapping with the p-type work function adjusting layer 122 and the second active region 30. The field region 40 and the second active region 30 are not exposed by the second part 85b of the trench 85.

One of sidewalls of the second part 85b of the trench 85 corresponds to the second part 122b of the p-type work function adjusting layer 122. The second part 122b of the p-type work function adjusting layer 122 protrudes in a direction normal to the substrate 10, between the first active region 20 and the second active region 30.

The width of the second part 85b of the trench 85 overlapping with the field region 40 corresponds to the second width W2 of the second dummy gate electrode 214 overlapping with the field region 40.

The second dummy gate electrode 214 may be removed by etching, for example, dry etching or wet etching.

Figure 21:
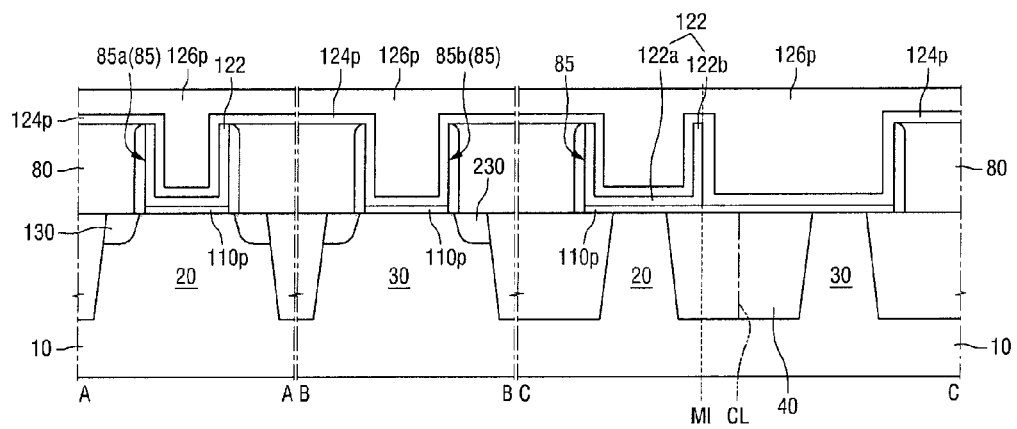

Referring to FIG. 21, a first electrode layer 124p may be formed along the top surface of the interlayer dielectric layer 80, the top surface of the p-type work function adjusting layer 122 and the sidewalls and bottom surface of the second part 85b of the trench 85.

After forming the first electrode layer 124p, a second electrode layer 126p may be formed on the first electrode layer 124p, the second electrode layer 126p filling the first part 85a of the trench 85 and the second part 85b of the trench 85. The second electrode layer 126p may also be formed along the top surface of the interlayer dielectric layer 80 while filling the first part 85a of the trench 85 and the second part 85b of the trench 85.

The first electrode layer 124p may include, for example, at least one of TiN, TaN, TaC, TaCN, TiAl, and TiAlC, and the second electrode layer 126p may include, for example, at least one of Al and W.

Referring to FIG. 4, the first electrode layer 124p and the second electrode layer 126p are planarized to expose the top surface of the interlayer dielectric layer 80. As the result, a gate structure 50 is formed, the gate structure 50 intersecting the first active region 20, the second active region 30 and the field region 40.

In this exemplary embodiment, gate structure 50 includes a first metal gate electrode 120 and a second metal gate electrode 220 directly contacting each other. The gate structure 50 includes a contact surface MI between the first metal gate electrode 120 and the second metal gate electrode 220. The contact surface MI may be defined by the p-type work function adjusting layer 122.

In addition, the first metal gate electrode 120 may not overlap with, that is, may not reach, the center line CL of the field region 40. Therefore, the contact surface MI between the first metal gate electrode 120 and the second metal gate electrode 220 is positioned closer to the first active region 20 than to the second active region 30.

Hereinafter, a method for fabricating the semiconductor device according to the fourth exemplary embodiment in accordance with principles of inventive concepts will be described with reference to FIGS. 1, 5, 16 and 22 to 25.

FIGS. 22 to 25 illustrate intermediate process steps in a method for fabricating the semiconductor device according to the fourth exemplary embodiment in accordance with principles of inventive concepts.

Figure 22:
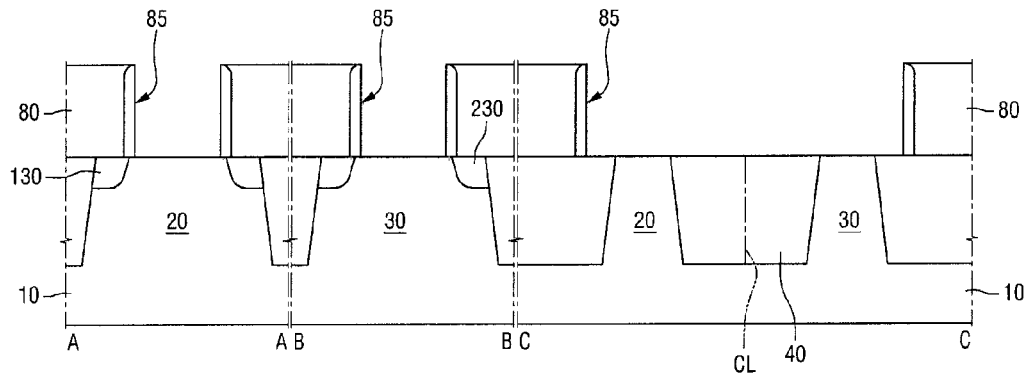
FIGS. 22 to 25 illustrate intermediate process steps in a method for fabricating the semiconductor device according to the fourth embodiment of inventive concepts.

Referring to FIGS. 16 and 22, a trench 85 may be formed in the interlayer dielectric layer 80 by removing the pre-gate dielectric layer 110p and the dummy gate structures 114 and 214 intersecting the first active region 20, the second active region 30 and the field region 40.

The method for fabricating the semiconductor device according to the fourth exemplary embodiment in accordance with principles of inventive concepts will be described with regard to a case where the pre-gate dielectric layer 110p is a dummy gate dielectric layer.

The trench 85 intersects the first active region 20, the second active region 30 and the field region 40 and exposes the first active region 20 and the second active region 30.

Figure 23:
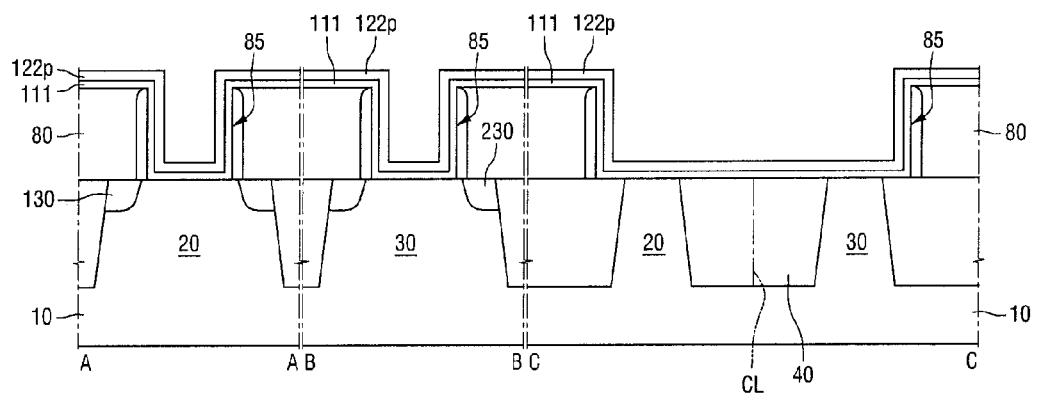

Referring to FIG. 23, a dielectric layer 111 and a conductive layer 122p are sequentially formed along a top surface of the interlayer dielectric layer 80 and sidewalls and bottom surface of the trench 85.

The dielectric layer 111 and the conductive layer 122p cover the first active region 20, the second active region 30 and the field region 40.

The dielectric layer 111 may include a high-k material, and the conductive layer 122p may include a material capable of controlling a work function of a pMOS.

Figure 24:
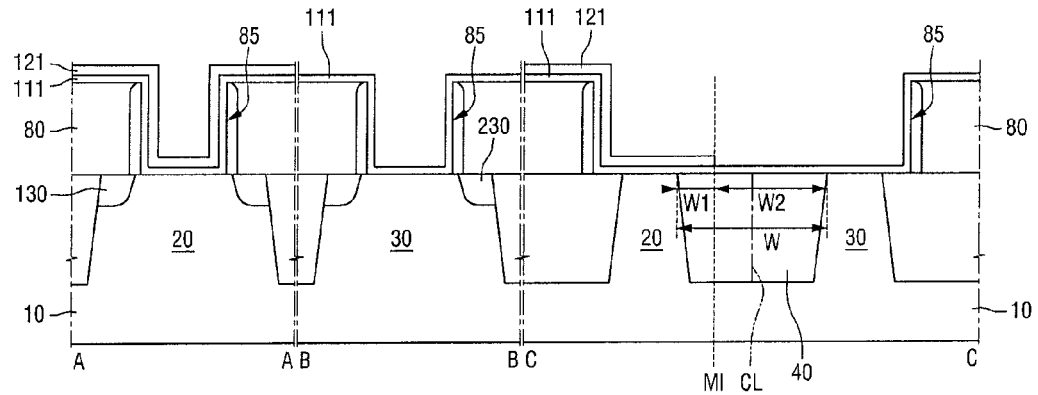

Referring to FIG. 24, a pre p-type work function adjusting layer 121 may be formed on the field region 40 and the first active region 20 by removing a portion of the conductive layer 122p. The pre p-type work function adjusting layer 121 may overlap with the field region 40 and the first active region 20.

The width of the pre p-type work function adjusting layer 121 overlapping with the field region 40 is a first width W1. The pre p-type work function adjusting layer 121 may not overlap with, that is, may not reach, center line CL of the field region 40.

The portion of the conductive layer 122p may be removed by, for example, wet etching or dry etching.

Figure 25:
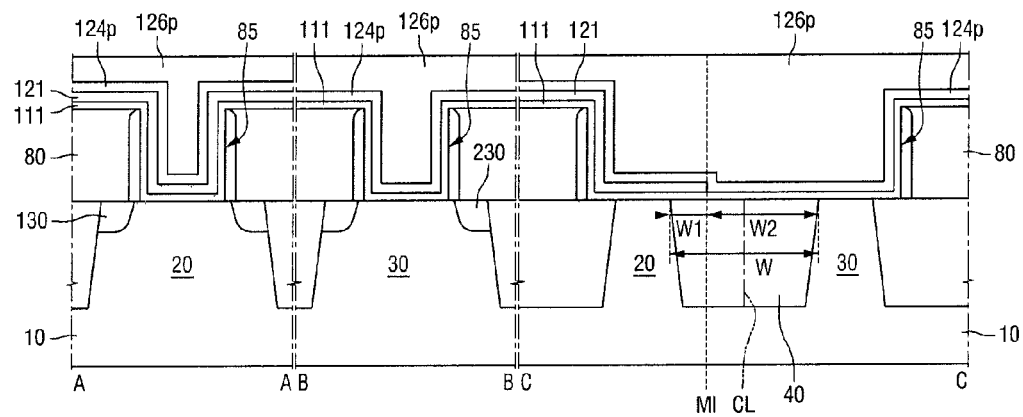

Referring to FIG. 25, a first conductive layer 122p may be formed along a top surface of the interlayer dielectric layer 80 and sidewalls and bottom surface of the trench 85.

Next, a second conductive layer 122p filling the trench 85 may be formed on the first conductive layer 122p. The second conductive layer 122p is also formed on the top surface of the interlayer dielectric layer 80.

Referring back to FIG. 5, the dielectric layer 111 formed on the top surface of the interlayer dielectric layer 80, the pre p-type work function adjusting layer 121, the first electrode layer 124p and the second electrode layer 126p are removed by a planarization process. As the result, the gate structure 50 intersecting the first active region 20, the second active region 30 and the field region 40 is formed.

Hereinafter, a method for fabricating the semiconductor device according to the fifth exemplary embodiment in accordance with principles of inventive concepts will be described with reference to FIGS. 6, 7 and 262 to 30.

FIGS. 26 to 30 illustrate intermediate process steps in a method for fabricating the semiconductor device according to the fifth exemplary embodiment in accordance with principles of inventive concepts.

Figure 26:
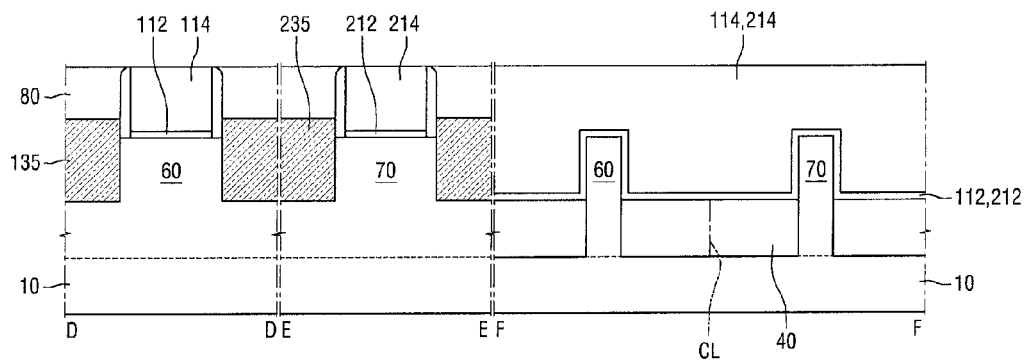
FIGS. 26 to 30 illustrate intermediate process steps in a method for fabricating the semiconductor device according to the fifth embodiment of inventive concepts.

Referring to FIG. 26, the first fin type active pattern 60 and the second fin type active pattern 70 adjacent to each other are formed on the substrate 10.

Field region 40 may be formed between the first fin type active pattern 60 and the second fin type active pattern 70 while making direct contact with the first fin type active pattern 60 and the second fin type active pattern 70. The field region 40 may be formed in contact with portions of the first fin type active pattern 60 and the second fin type active pattern 70. The field region 40 includes the center line CL equidistantly spaced apart from the first active region 20 and the second active region 30.

The first fin type active pattern 60 is a p-type FINFET forming region and the second fin type active pattern 70 is an n-type FINFET forming region.

Next, the dummy gate dielectric layers 112 and 212 and the dummy gate structures 114 and 214 intersecting the first fin type active pattern 60, the field region 40 and the second fin type active pattern 70 are formed on the substrate 10.

The dummy gate structures 114 and 214 include a first dummy gate electrode 114 intersecting the first fin type active pattern 60 and a second dummy gate electrode 214 intersecting the second fin type active pattern 70. In addition, the dummy gate dielectric layers 112 and 212 include a first dummy gate dielectric layer 112 formed between the first fin type active pattern 60 and the first dummy gate electrode 114 and a second dummy gate dielectric layer 212 formed between the second fin type active pattern 70 and the second dummy gate electrode 214.

The dummy gate dielectric layers 112 and 212 may include silicon oxide and the dummy gate structures 114 and 214 include one of polycrystalline silicon (poly Si), amorphous silicon (a-Si) and a combination thereof.

Next, the first fin type active pattern 60 and the second fin type active pattern 70 exposed at both sides of the dummy gate structures 114 and 214 are recessed. The first elevated source/drain 135 and the second elevated source/drain 235 are formed on the recessed first and second fin type active patterns 60 and 70, respectively.

Next, the interlayer dielectric layer 80 covering the dummy gate structures 114 and 214, the first elevated source/drain 135 and the second elevated source/drain 235 may be formed on the substrate 10.

Next, the interlayer dielectric layer 80 may be planarized to expose top surfaces of the dummy gate structures 114 and 214.

Figure 27:
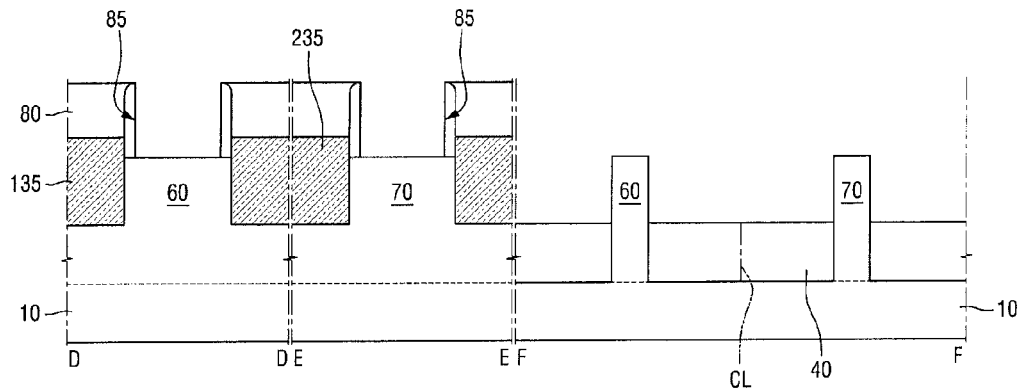

Referring to FIG. 27, the dummy gate structures 114 and 214 and the dummy gate dielectric layers 112 and 214 are sequentially removed, thereby forming the trench 85 exposing the first fin type active pattern 60, the field region 40 and the second fin type active pattern 70 in the interlayer dielectric layer 80.

The first fin type active pattern 60 and the second fin type active pattern 70 are exposed by the trench 85.

Figure 28:
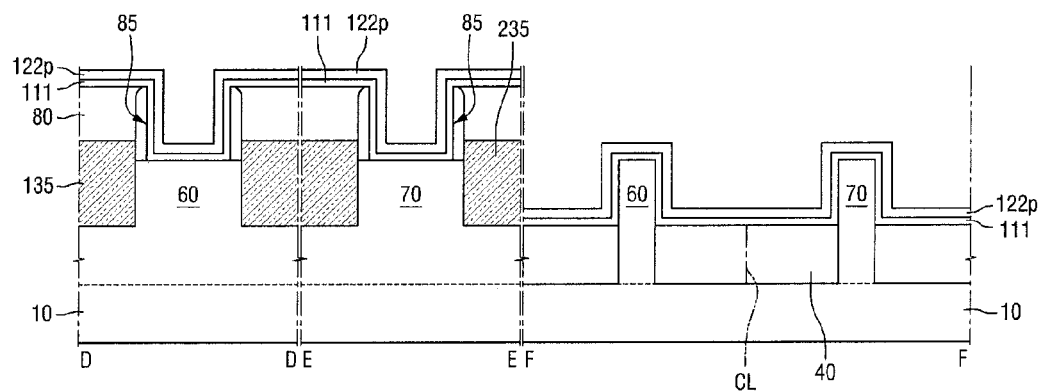

Referring to FIG. 28, the dielectric layer 111 and the conductive layer 122p covering the first fin type active pattern 60, the field region 40 and the second fin type active pattern 70 are sequentially formed.

The dielectric layer 111 and the conductive layer 122p are formed along the top surface of the interlayer dielectric layer 80, the sidewalls and bottom surface of the trench 85, and the first fin type active pattern 60 and the second fin type active pattern 70 protruding from the field region 40.

Figure 29:
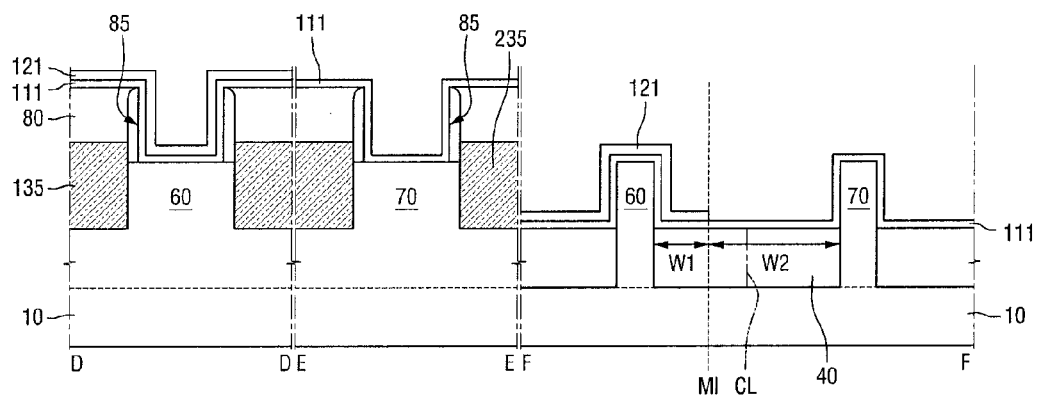

Referring to FIG. 29, the pre p-type work function adjusting layer 121 may be formed on the field region 40 and the first fin type active pattern 60 by removing a portion of the conductive layer 122p.

The pre p-type work function adjusting layer 121 overlaps with the field region 40 and the first fin type active pattern 60 while not overlapping with the center line of the field region 40. The width of the pre p-type work function adjusting layer 121 overlapping with the field region 40 corresponds to the first width W1.

Figure 30:
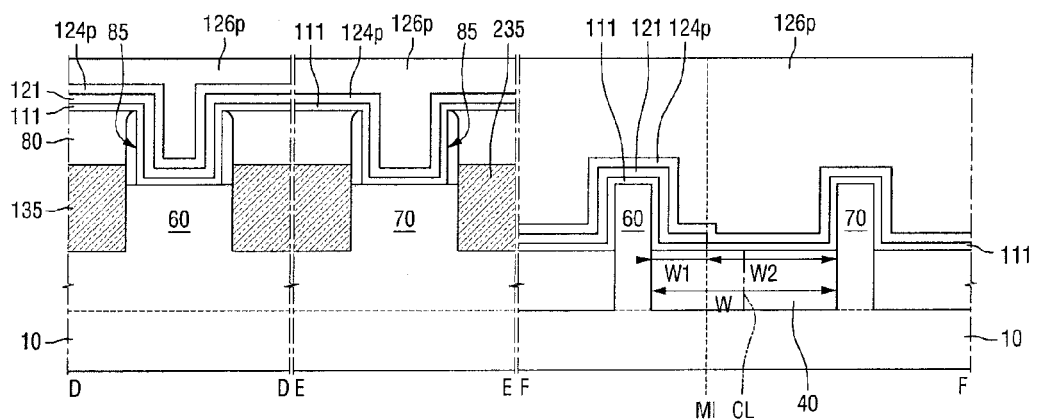

Referring to FIG. 30, the first conductive layer 122p may be formed along the top surface of the interlayer dielectric layer 80, the sidewalls and bottom surface of the trench 85, and the first fin type active pattern 60 and the second fin type active pattern 70 protruding from the field region 40.

Next, the second conductive layer 122p filling the trench 85 may be formed on the first conductive layer 122p. The second conductive layer 122p is also formed on the interlayer dielectric layer 80.

Referring back to FIG. 7, the dielectric layer 111 formed on the top surface of the interlayer dielectric layer 80, the pre p-type work function adjusting layer 121, the first electrode layer 124p and the second electrode layer 126p are removed by a planarization process. As a result, the gate structure 50 may be formed, the gate structure 50 intersecting the first fin type active pattern 60, the second fin type active pattern 70 and the field region 40.

While exemplary embodiments of inventive concepts has been particularly shown and described with reference to exemplary embodiments thereof, it will be understood by those of ordinary skill in the art that various changes in form and details may be made therein without departing from the spirit and scope of inventive concepts as defined by the following claims. It is therefore desired that the present embodiments be considered in all respects as illustrative and not restrictive, reference being made to the appended claims rather than the foregoing description to indicate the scope of inventive concepts.

What is claimed is:

1. A semiconductor device comprising:
    a substrate including a first active region, a second active region and a field region, the field region being disposed between the first active region and the second active region, the field region directly contacting both the first active region and the second active region; and
    a gate structure disposed on or above the substrate, the gate structure crossing the first active region, the second active region and the field region, the gate structure including a first metal gate electrode and a second metal gate electrode, the first metal gate electrode directly contacting the second metal gate electrode,
    wherein the first metal gate electrode is disposed on or above the first active region,
    the second metal gate electrode is disposed on or above the second active region,
    a contact surface between the first metal gate electrode and the second metal gate electrode is closer to the first active region than to the second active region,
    the first metal gate electrode includes a work function layer and a first upper metal gate electrode disposed on or above the work function layer,
    the second metal gate electrode includes a second upper metal gate electrode,
    a depth of the second upper metal gate electrode is greater than a depth of the first upper metal gate electrode, and
    the contact surface is disposed on or above the field region.
2. The semiconductor device of claim 1, wherein the first metal gate electrode includes a first lower metal gate electrode disposed on the work function layer, and the second metal gate electrode includes a second lower metal gate electrode disposed beneath the second upper metal gate electrode.

3. The semiconductor device of claim 1, wherein the first active region is a PMOS forming region, and the second active region is an NMOS forming region.

4. The semiconductor device of claim 1, further comprising a dielectric layer disposed between the substrate and the gate structure.

5. The semiconductor device of claim 1, wherein a depth of the first metal gate electrode is substantially the same as a depth of the second metal gate electrode.

6. The semiconductor device of claim 1, wherein a shortest distance between the substrate and the first upper metal gate electrode is greater than a shortest distance between the substrate and the second upper metal gate electrode.

7. The semiconductor device of claim 1, wherein the depth of the second upper metal gate electrode that is disposed on or above the field region is greater than the depth of the first upper metal gate electrode that is disposed on or above the field region.

8. The semiconductor device of claim 1, wherein the first upper metal gate electrode and the second upper metal gate electrode are formed with the same material.

9. A semiconductor device comprising:
a substrate including a first active region, a second active region and a field region, the field region being disposed between the first active region and the second active region, the field region directly contacting both the first active region and the second active region; and
a gate structure disposed on or above the substrate, the gate structure crossing the first active region, the second active region and the field region, the gate structure including a first metal gate electrode and a second metal gate electrode, the first metal gate electrode directly contacting the second metal gate electrode,
wherein the first metal gate electrode is disposed on or above the first active region,
the second metal gate electrode is disposed on or above the second active region,
the first metal gate electrode includes a first upper metal gate electrode,
the second metal gate electrode includes a second upper metal gate electrode, and
a depth of the second upper metal gate electrode is greater than a depth of the first upper metal gate electrode,
wherein a contact surface between the first metal gate electrode and the second metal gate electrode is closer to the first active region than to the second active region.

10. The semiconductor device of claim 9, wherein the first metal gate electrode includes a work function layer, a first lower metal gate electrode disposed on the work function layer, and a first upper metal gate electrode disposed on the first lower metal gate electrode,
the second metal gate electrode includes a second lower metal gate electrode, a second upper metal gate electrode disposed on the second lower metal gate electrode, and a depth of the first metal gate electrode is substantially the same as a depth of the second metal gate electrode.

11. The semiconductor device of claim 9, wherein the depth of the second upper metal gate electrode that is disposed on or above the field region is greater than the depth of the first upper metal gate electrode that is disposed on or above the field region.

12. The semiconductor device of claim 9, wherein the contact surface is disposed on or above the field region.

13. The semiconductor device of claim 9, wherein the first active region is a PMOS forming region, and the second active region is an NMOS forming region.

14. The semiconductor device of claim 9, further comprising an interlayer dielectric layer disposed on or above the substrate, and a top surface of the gate structure is coplanar with a top surface of the interlayer dielectric layer.

15. The semiconductor device of claim 9, wherein the first metal gate electrode includes an insertion conductive layer between the first upper metal gate electrode and the substrate, and the insertion conductive layer does not extend on or above the second active region.

16. A semiconductor device comprising:
a substrate including a first fin active pattern, a second fin active pattern and a field pattern, the field pattern being disposed between the first fin active pattern and the second fin active pattern, the field pattern directly contacting both the first fin active pattern and the second fin active pattern; and
a gate structure intersecting the first fin active pattern, the field pattern and the second fin active pattern,
wherein the gate structure includes a first metal gate electrode and a second metal gate electrode directly contacting each other,
the first metal gate electrode is disposed on or above the first fin active pattern,
the second metal gate electrode is disposed on or above the second fin active pattern,
a contact surface between the first metal gate electrode and the second metal gate electrode is closer to the first fin active pattern than to the second fin active pattern,
the first metal gate electrode includes a first upper metal gate electrode,
the second metal gate electrode includes a second upper metal gate electrode, and
a depth of the second upper metal gate electrode is greater than a depth of the first upper metal gate electrode.

17. The semiconductor device of claim 16, wherein the first metal gate electrode includes a work function layer.

18. The semiconductor device of claim 16, wherein the first active region is a PMOS forming region, and the second active region is an NMOS forming region.

19. The semiconductor device of claim 16, wherein the first fin active pattern and the second fin active pattern protrude from the field pattern.

20. The semiconductor device of claim 19, further comprising a gate dielectric layer covering sidewalls and a top surface of the first fin active pattern, and sidewalls and a top surface of the second fin active pattern.

* * * * *